(12) United States Patent
Moustakas

(10) Patent No.: US 6,953,703 B2
(45) Date of Patent: Oct. 11, 2005

(54) METHOD OF MAKING A SEMICONDUCTOR DEVICE WITH EXPOSURE OF SAPPHIRE SUBSTRATE TO ACTIVATED NITROGEN

(75) Inventor: Theodore D. Moustakas, Dover, MA (US)

(73) Assignee: The Trustees of Boston University, Boston, MA (US)

( * ) Notice: Subject to any disclaimer, the term of this patent is extended or adjusted under 35 U.S.C. 154(b) by 0 days.

(21) Appl. No.: 10/610,332

(22) Filed: Jun. 30, 2003

(65) Prior Publication Data

US 2004/0053478 A1 Mar. 18, 2004

Related U.S. Application Data

(62) Division of application No. 08/560,494, filed on Nov. 17, 1995, now abandoned, which is a division of application No. 08/371,708, filed on Jan. 13, 1995, now Pat. No. 5,633,192, which is a continuation-in-part of application No. 08/113,964, filed on Aug. 30, 1993, now Pat. No. 5,385,862, which is a continuation of application No. 07/670,692, filed on Mar. 18, 1991, now abandoned.

(51) Int. Cl.⁷ ............................................. H01L 21/00
(52) U.S. Cl. ..................... 438/46; 117/105; 117/108; 438/479
(58) Field of Search ................... 438/46, 479; 117/105, 117/108; 257/E21.099

(56) References Cited

U.S. PATENT DOCUMENTS

| | | | |
|---|---|---|---|
| 3,528,387 A | 9/1970 | Hamilton | 118/49.1 |
| 3,683,240 A | 8/1972 | Pankove | 317/234 |
| 3,819,974 A | 6/1974 | Stevenson et al. | 313/499 |
| 3,829,556 A | 8/1974 | Logan et al. | 423/409 |
| 3,922,271 A | 11/1975 | Lamberti | 260/247 |

(Continued)

FOREIGN PATENT DOCUMENTS

| | | | |
|---|---|---|---|
| DE | 3802732 A1 | 1/1988 | H01L/21/205 |
| DE | 3802732 | 1/1988 | H01L/21/205 |
| DE | 4006449 | 3/1990 | H01L/21/205 |
| DE | 39 43 232 A1 | 7/1990 | |
| EP | 0 132 139 B1 | 7/1984 | |

(Continued)

OTHER PUBLICATIONS

Rubin et al., "P–Type Gallium Nitride by Reactive Ion–Beam molecular Beam Epitaxy with Ion Implantation, Diffusion, or Coevaporation of Mg", Appl. Phys. Letters, vol. 64, No. 1, Jan. 1994.

Beresford, R., "Growing GaN by Plasma–Assisted Molecular–Beam Epitaxy", JOM, vol. 46, No. 3, Mar. 1994.

Lei et al., "Epitaxial Growth of Zinc Blende and Wurtzitic Gallium Nitride Thin Films on (001) Silicon", Appl. Phys. Letters, vol. 320, No. 8, Aug. 1991.

Paisley et al., "Growth of Gallium Nitride on Silicon Carbide by Molecular Beam Epitaxy", SPIE, Micro–Optoelectronic Materials, vol. 877, 1998.

(Continued)

Primary Examiner—George Fourson
Assistant Examiner—Fernando L. Toledo
(74) Attorney, Agent, or Firm—Weingarten, Schurgin, Gagnebin & Lebovici LLP

(57) ABSTRACT

An epitaxial growth system comprises a housing around an epitaxial growth chamber. A substrate support is located within the growth chamber. A gallium source introduces gallium into the growth chamber and directs the gallium towards the substrate. An activated nitrogen source introduces activated nitrogen into the growth chamber and directs the activated nitrogen towards the substrate. The activated nitrogen comprises ionic nitrogen species and atomic nitrogen species. An external magnet and/or an exit aperture control the amount of atomic nitrogen species and ionic nitrogen species reaching the substrate.

17 Claims, 16 Drawing Sheets

U.S. PATENT DOCUMENTS

| | | | |
|---|---|---|---|
| 3,980,044 A | 9/1976 | Zollinger | 118/49.1 |
| 3,992,233 A | 11/1976 | Farrow | 148/175 |
| 4,095,311 A | 7/1978 | Rutz | 29/589 |
| 4,144,116 A | 3/1979 | Jacob et al. | 156/611 |
| 4,153,905 A | 5/1979 | Charmakadze et al. | 357/16 |
| 4,268,842 A | 5/1981 | Jacob et al. | 357/17 |
| 4,379,020 A | 4/1983 | Glaeser et al. | 156/603 |
| 4,420,684 A | 12/1983 | Gauthier | 250/211 |
| 4,448,633 A | 5/1984 | Shuskus | 156/610 |
| 4,473,938 A | 10/1984 | Kobayashi et al. | 29/569 |
| 4,476,620 A | 10/1984 | Ohki et al. | 29/569 |
| 4,483,725 A | 11/1984 | Chang | 148/175 |
| 4,575,925 A | 3/1986 | Kambara et al. | 29/576 |
| 4,585,541 A | 4/1986 | Miyake et al. | 204/298 |
| 4,589,015 A | 5/1986 | Nakata et al. | 358/55 |
| 4,608,581 A | 8/1986 | Bagratishvili et al. | 357/17 |
| 4,614,961 A | 9/1986 | Khan et al. | 357/30 |
| 4,615,766 A | 10/1986 | Jackson et al. | 156/662 |
| 4,616,248 A | 10/1986 | Khan et al. | 357/30 |
| 4,645,977 A | 2/1987 | Kurokawa et al. | 315/111.21 |
| 4,683,838 A | 8/1987 | Kimura et al. | 118/715 |
| 4,766,971 A | 8/1988 | Hyodo | 180/178 |
| 4,792,467 A | 12/1988 | Melas et al. | 427/248.1 |
| 4,800,100 A | 1/1989 | Herbots et al. | 427/38 |
| 4,819,057 A | 4/1989 | Naito et al. | 357/17 |
| 4,819,058 A | 4/1989 | Nishizawa | 357/17 |
| 4,855,249 A | 8/1989 | Akasaki et al. | 437/81 |
| 4,862,471 A | 8/1989 | Pankove | 372/42 |
| 4,862,877 A | 9/1989 | Barber | 128/77 |
| 4,866,007 A | 9/1989 | Taguchi et al. | 437/108 |
| 4,897,149 A | 1/1990 | Suzuki et al. | 156/610 |
| 4,906,900 A | 3/1990 | Asmussen | 315/111.81 |
| 4,908,074 A | 3/1990 | Hosoi et al. | 148/33 |
| 4,911,102 A | 3/1990 | Manabe et al. | 118/719 |
| 4,918,497 A | 4/1990 | Edmond | 357/17 |
| 4,941,430 A | 7/1990 | Watanabe et al. | 118/723 |
| 4,946,547 A | 8/1990 | Palmour et al. | 156/643 |
| 4,946,548 A | 8/1990 | Kotaki et al. | 156/643 |
| 4,947,085 A | 8/1990 | Nakanishi et al. | 315/111.41 |
| 4,960,728 A | 10/1990 | Schaake et al. | 437/82 |
| 4,966,862 A | 10/1990 | Edmond | 437/100 |
| 4,966,867 A | 10/1990 | Crotti et al. | 437/195 |
| 4,967,089 A | 10/1990 | Reilly et al. | 250/493 |
| 4,980,730 A | 12/1990 | Mishima et al. | 357/17 |
| 4,983,249 A | 1/1991 | Taguchi et al. | 156/603 |
| 4,985,742 A * | 1/1991 | Pankove | 257/197 |
| 4,990,972 A | 2/1991 | Satoh et al. | 357/17 |
| 4,999,082 A | 3/1991 | Kremer et al. | 156/605 |
| 5,005,057 A | 4/1991 | Izumiya et al. | 357/17 |
| 5,006,908 A | 4/1991 | Matsuoka et al. | 357/17 |
| 5,010,033 A | 4/1991 | Tokunaga et al. | 437/83 |
| 5,015,327 A | 5/1991 | Taguchi et al. | 156/603 |
| 5,016,563 A | 5/1991 | Murakami et al. | 118/723 |
| 5,024,182 A | 6/1991 | Kobayashi et al. | 118/723 |
| 5,027,168 A | 6/1991 | Edmond | 357/17 |
| 5,042,043 A | 8/1991 | Hatano et al. | 372/45 |
| 5,063,421 A | 11/1991 | Suzuki et al. | 357/17 |
| 5,068,204 A | 11/1991 | Kukimoto et al. | 437/127 |
| 5,076,860 A | 12/1991 | Ohba et al. | 148/33.1 |
| 5,079,184 A | 1/1992 | Hatano et al. | 437/107 |
| 5,093,576 A | 3/1992 | Edmond et al. | 250/370.01 |
| 5,097,298 A | 3/1992 | Ehara | 357/17 |
| 5,111,052 A | 5/1992 | Ohtsuchi et al. | 250/370.01 |
| 5,111,111 A | 5/1992 | Stevens et al. | 315/111.41 |
| 5,119,540 A | 6/1992 | Kong et al. | 29/25.01 |
| 5,122,845 A | 6/1992 | Manabe et al. | 357/17 |
| 5,140,385 A | 8/1992 | Kukimoto et al. | 357/17 |
| 5,143,896 A | 9/1992 | Harada et al. | 505/1 |
| 5,146,465 A | 9/1992 | Khan et al. | 372/45 |
| 5,173,751 A | 12/1992 | Ota et al. | 257/76 |
| 5,178,911 A | 1/1993 | Gordon et al. | 427/255.2 |
| 5,181,986 A | 1/1993 | Ohiwa | 156/643 |
| 5,182,670 A | 1/1993 | Khan et al. | 359/359 |
| 5,192,419 A | 3/1993 | Matsuura et al. | 205/244 |
| 5,200,022 A | 4/1993 | Kong et al. | 156/612 |
| 5,205,905 A | 4/1993 | Kotaki et al. | 156/662 |
| 5,210,051 A | 5/1993 | Carter, Jr. | 437/107 |
| 5,211,825 A | 5/1993 | Saito et al. | 204/192.32 |
| 5,218,216 A | 6/1993 | Manabe et al. | 257/103 |
| 5,237,182 A | 8/1993 | Kitagawa et al. | 257/15 |
| 5,243,204 A | 9/1993 | Suzuki et al. | 257/77 |
| 5,248,631 A | 9/1993 | Park et al. | 437/105 |
| 5,272,108 A | 12/1993 | Kozawa | 437/127 |
| 5,278,433 A | 1/1994 | Manabe et al. | 257/103 |
| 5,290,393 A | 3/1994 | Nakamura | 156/613 |
| 5,298,767 A | 3/1994 | Shor et al. | 257/77 |
| 5,300,793 A | 4/1994 | Kondow et al. | 257/12 |
| 5,302,266 A | 4/1994 | Grabarz et al. | 204/192.12 |
| 5,304,820 A | 4/1994 | Tokunaga et al. | 257/88 |
| 5,306,662 A | 4/1994 | Nakamura et al. | 437/107 |
| 5,307,363 A | 4/1994 | Hosokawa et al. | 372/53 |
| 5,313,078 A | 5/1994 | Fujii et al. | 257/77 |
| 5,316,585 A | 5/1994 | Okamoto et al. | 118/719 |
| 5,323,022 A | 6/1994 | Glass et al. | 257/77 |
| 5,329,141 A | 7/1994 | Suzuki et al. | 257/103 |
| 5,321,713 A | 8/1994 | Khan et al. | 372/45 |
| 5,334,277 A | 8/1994 | Nakamura | 117/102 |
| 5,338,944 A | 8/1994 | Edmond et al. | 257/76 |
| 5,356,672 A | 10/1994 | Schmitt, III et al. | 427/446 |
| 5,359,345 A | 10/1994 | Hunter | 345/102 |
| 5,385,862 A | 1/1995 | Moustakas | 437/107 |
| 5,398,641 A | 3/1995 | Shih | 117/101 |
| 5,506,405 A | 4/1996 | Yoshida et al. | 250/251 |
| 5,511,509 A | 4/1996 | Shih | 117/200 |
| 5,512,102 A | 4/1996 | Yamazaki | 118/723 |
| 5,530,267 A | 6/1996 | Brandle, Jr. et al. | 257/76 |
| 5,549,747 A | 8/1996 | Bozler et al. | 117/43 |
| 5,585,648 A | 12/1996 | Tischler | 257/77 |
| 5,657,335 A | 8/1997 | Rubin et al. | 372/44 |
| 5,733,796 A | 3/1998 | Manabe et al. | 437/127 |
| 6,249,092 B1 | 7/2001 | Manabe et al. | 257/103 |

FOREIGN PATENT DOCUMENTS

| | | | |
|---|---|---|---|
| EP | 0 277 597 A2 | 1/1988 | |
| EP | 0 383 215 A2 | 2/1990 | |
| EP | 0 568 177 A2 | 3/1993 | C30B/23/02 |
| GB | 2194555 | 3/1988 | C23C/14/48 |
| JP | 354004567 | 1/1979 | H01L/21/203 |
| JP | 57010280 | 1/1982 | |
| JP | 57087184 | 5/1982 | |
| JP | 58012381 | 1/1983 | |
| JP | 58046685 | 3/1983 | |
| JP | 59-135383 | 3/1984 | G01T/1/24 |
| JP | 59057997 | 4/1984 | |
| JP | 53719/86 | 8/1984 | 21/205 |
| JP | 6277454 | 9/1985 | C23C/14/06 |
| JP | 0228672 | 11/1985 | |
| JP | 6 0228672 | 11/1985 | C23C/14/24 |
| JP | 61018184 | 1/1986 | |
| JP | 32414 | 2/1986 | 21/230 |
| JP | 61135126 | 6/1986 | H01L/21/31 |
| JP | 361242988 | 10/1986 | C30B/23/08 |
| JP | 361242989 | 10/1986 | C30B/23/08 |
| JP | 63188933 | 8/1988 | H01L/21/205 |
| JP | 363239182 | 10/1988 | C30B/23/08 |
| JP | 0022027 | 1/1989 | H01L/21/22 |
| JP | 6430110 | 2/1989 | H01L/12/06 |
| JP | 1155630 | 6/1989 | H01L/21/318 |
| JP | 252422 | 2/1990 | H01L/21/205 |
| JP | 2081482 | 3/1990 | |
| JP | 2081483 | 3/1990 | H01L/33/00 |

| JP | 2081484 | 3/1990 | |
| JP | 2228476 | 9/1990 | ............ C23C/16/50 |
| JP | 2250876 | 10/1990 | ............ C23C/15/50 |
| JP | 2257678 | 10/1990 | .......... H01L/21/205 |
| JP | 404013875 | 1/1992 | ............ C23C/16/50 |
| JP | 405234903 | 9/1993 | .......... H01L/21/205 |
| JP | 256090 | 9/1994 | ............ C30B/23/08 |
| JP | 314652 | 11/1994 | .......... H01L/21/203 |
| JP | 6153719 | 3/1996 | .......... H01L/20/205 |
| JP | 1223632 | 9/1999 | ............ G11B/5/85 |

OTHER PUBLICATIONS

Varrio et al., "New Approach to Growth of High–Quality GaAs Layers on Si substrates", Appl. Phys. Letters, vol 51, No. 22, Nov. 1997.

Molnar et al., "Electron Transport Mechanism in Gallium Nitride", Publication Date, Apr. 1, 1993 pp72–74. 1993.

Hauenstein et al., "Reflection High Energy Electron Diffraction Study of Nitrogen Plasma Interactions with a GaAs (100) Surface", Publication Date, May 22, 1995, pp 2861–2863 1995.

Misra et al., "Photoconducting Ultraviolet Detectors Based on GaN Films Grown by Electron Cyclotron Resonance Molecular Beam Epitaxy", Publication Date, Jul. 13, 1995, pp. 78–86, 1995.

Author Unknown, "Title Unknown", Appl. Phys. Letters, vol. 17, No. 19, Nov. 15, 1970.

Stevens et al., "Photoconductive Ultraviolet Sensor Using Mg–Doped GaN on Si (III)", Appl. Phys. Letters, vol. 66, No. 25, Jun. 19, 1995.

Molnar et al., "Blue–Violet Light Emitting Falliumj Nitride p–n Junctions Grown by Electron Cyclotron Resonance–Assisted Molecular Beam Epitaxy", Appl. Phys. Letters, Year Unknown.

Lin et al., "A Comparative Study of GaN Epilayers Grown on Sapphire and SiC Substrates by Plasma–Assisted Molecular–Beam Epitaxy", Appl. Phys. Letters, vol. 62, No. 26, Jun. 28, 1993.

Fu et al., "The Influence of Nitrogen Ion Energy on the Quality of GaN Films Grown with Molecular Beam Epitaxy", Journal of Electronic Materials, vol. 24, No. 4, 1995.

Stevens et al., "Growth of Group III Nitrides on Si(III) by Plasma–Assisted Molecular Beam Epitaxy", J. Vac. Sci. Technol, vol. 12, No. 2, 1994.

Hughes et al., "Molecular Beam Epitaxy Growth and Properties of GaN films on GaN/SiC Substrates", J. Vac. Sci Technol., vol. 13, No. 4, 1995.

Powell et al., "Hetroepitaxial Wurtizite and Zinc–Blende Structure GaN Grown by Reactive–Ion Molecula–Beam Epitaxy: Growth Kinetics, Microstructure, and Properties", J. Appl. Phys., vol. 73, No. 1, Jan. 1993.

Maruska et al., "Mechanism of Light Production in Metal–Insulator–Semiconductor Diodes: GaN:Mg Violet Light–Emitting Diodes", Solid State Electronics, vol. 17, pp 1171–1179, 1974.

Boulou et al., "Light–Emitting Diodes Based on GaN", Philips Tech. Rev, vol. 37, No. 9/10, pp 237–240, 1977.

Lei et al., "Epitaxial Growth and Characterization of Zinc–Blende Gallium Nitride on (001) Silicon", J. Appl. Phys. vol. 71, No. 10, May 15, 1992.

Amano et al., "P–Type Conduction in Mg–Doped GaN Treated with Low Energy Electron Beam Irradiation", Japanese Journal of Applied Physics, vol. 28, No. 12, Dec. 1989.

Ohtani et al., "Microstructure and Photoluminescence of GaN Growth on Si(III) by Plasma–Assisted Molecular Beam Epitaxy", Appl Phys. Letters, vol. 65, No. 4, Jul. 4, 1994.

Yasuo Koide et al., "Effect of an AIN Buffer Layer on AIGaN/alpah–$Al_2O_3$", Journal Unknown, vol. 13, No. 4, 1986.

Yoshida et al., "Improvements on the Electrical and Luminescent Properties of Reactive Molecular Beam Epitaxially Grown GaN Films by Using AIN–Coated Sapphire Substrates", Appl. Phys Letters, vol. 42, No. 5, Mar. 1, 1983.

Amano et al., "Effects of the Buffer Layer in Metalorganic Vapour Phase Epitaxy of GaN on Sapphire Substrate", Thins Solid Films, vol. 163, pp. 415–420, 1988.

Amano et al., "Metalorganic Vapor Phase Epitaxial Growth of High Quality GaN Film Using an AIN Buffer Layer", Appl. Phys. Letters, vol. 48, No. 5, Feb. 3, 1986.

Khan et al., "Edge Emission of $Al_xGa_{1-x}N$", Solid State Communications, vol. 60, No. 6, pp 509–512, 1986.

Nagatomo et al., "Epitaxial Growth of GaN Films by Low Pressure Metalorganic Chemical Vapor Deposition", Extended Abstracts, Fall Meeting, Honolulu, Hawaii, vol. 87, No. 2, Oct. 1987.

Kawakami et al., "Epitaxial Growth on AIN Film with an Initial–Nitriding Layer on a alpha–$Al_2O_3$ Substrate", Japanese Journal of Applied Physics, vol. 27, No. 2, Feb. 1988.

Akasaki et al., "Effects of AIN Buffer Layer on Crystallographic Structure and on Electrical and Optical Properties of GaN and $Ga_{1-x}Al_xN$ Films Grown on Sapphire Substrate by MOVPE", Journal of Crystal Growth, vol. 98, 1989.

Goldenberg et al., "Ultraviolet and Violet Light–Emitting GaN Diodes Grown by Low–Pressure Metalorganic Chemical Vapor Deposition", Appl. Phys. Letters, vol. 62, No. 4, Jan. 25, 1993.

Moriizumi et al., Epitaxial Vapor Growth of ZnTe on InAs, Japanese Journal Appl. Phys., vol. 9, 1970.

Akasaki et al., "Photoluminescence of Mg–doped P–Type GaN and Electroluminescence of GaN p–n Junction LED", Journal of Luminescence, vol. 48 & 49, 1991.

Akihiko Yoshikawa et al., "Effects of Ar Ion Laser Irradiation on MOVPE of ZnSe Using DMZn and DMSe as Reactants", Journal of Crystal Growth, vol. 107, 1991.

Sitar et al., "Design and Performance of an Electron Cyclotron Resonance Source for Standard Molecular Beam Epitaxy Equipment", Rev. Sci. Instrum, vol. 61, No. 9, 1990.

Amana et al., Fabrication and Properties of GaN P–N Junction LED; Nagoya University, Department of Electronics, Jagoya 464–01, Japan; Dec. 1, 1990; pp. 165–168.

Boulou et al., Light–emitting diodes based on GaN, Philips Tech., Rev. 37; pp. 237–240; 1997, No. 9/10.

Fremunt et al., Optimized Growth Conditions of GaN Epitaxial Layers, Crystal Research and Technology, pp. 1257–66 (date unknown).

Gotoh et al., Low Temperature Growth of Gallium Nitride, Japanese Journal of Applied Physics, vol. 20, No. 7; Jul. 1981, pp. L545–48.

Hiramatsu et al., MOVPE GaN–Effects of Buffer Layer in MOVPE Growth GaN Film on Sapphirre Substrate; Nagoya University; Toyoda Gosei Co., Ltd.; vol. 15, No. 3 & 4, 1988, pp. 334–342.

Hiramatsu et al., Cathodoluminescence of Movpe–Growth GaN Layer $On_a$–$Al_2O_3$, Nagoya University, Journal of Crystal Growth 99; 1990, pp. 375–380.

Jacob, Croissance expitaxiale de GaN, Acta Electronica, vol. 21, No. 2, 1978, pp. 101–178.

Jenkins et al., Electronic Structures and Doping of InN, InxGa1–xN, and InxAl1–xN; Physical Review B, vol. 39, No. 5, Feb. 15, 1980; ©1989 The American Physical Society, pp. 3317–3329.

Karpinski et al., High Pressure Vapor Growth of GaN, Journal of Crystal Growth 56 (1982); ©1982 North–Holland, pp. 77–82.

Kawabata et al., GaN blue light emitting diodes prepared by metalorganic chemical vapor deposition; J. Appl. Phys. 56(8); Oct. 15, 1984; © 1984 American Institute of Physics; pp. 2367–68.

Khan et al., Properties and ion implantation of AlxGa1–xN epitaxial single crystal films prepared by low pressure metalorganic chemical vapor deposition; Appl. Phys. Lett. 43(5); Sep. 1, 1983; © 1983 American Institute of Physice, pp. 492–94.

Moustakas, Molecular Beam Epitaxy: Thin Film Growth and Surface Studies, MRS Bulletin, vol. XIII, No. 11, Nov. 1988, pp. 29–34.

Nagatomo et al., Epitaxial Growth of GaN Films by Reactive Ion Plating: The Transaction of the IECE of Japan, vol. E.69, No. 4, Apr. 9186, pp. 482–84.

Nakamura et al., Highly P–Typed Mg–Doped GaN Films Grown with GaN Buffer Layers, Japanese Journal of Applied Physics, vol. 30, No. 10A, Oct. 1991, pp. L1708–L1711.

Nakamura et al., Novel Metalorganic chemical vapor deposition system for GaN Growth, Appl. Phys. Lett. 58(18), May 6m, 1991; © 1991 American Institute of Physics, pp. 2021–23.

Naniwae et al., Growth of Single Crystal GaN Substrate Using Hydride Vapor Phase Epitaxy; Japan Journal of Crystal Growth 99 (1990); pp. 381–384.

Sadana et al., Recrystallization of amorphous gillium arsinide by ion beams; Appl. Phys. Lett. 44(3); Feb. 1, 1984; © 1984 American Institute of Physics.

Sitar et al., Growth of AlN/GaN layered structures by gas source molecular–beam epitaxy; J. Vac. Sci. Technmol. B, vol. 8, No. 2, Mar/Apr. 1990; © 1990, American Vacuum Society, pp. 316–322.

Sugimura et al., Heteroepitaxial Growth of GaAs on Sapphire Substrates by a Three–Step method Using Low Pressure MOCVD; Journal of Crystal Growth 77 (1986); pp. 524–29.

* cited by examiner

METHOD OF MAKING A SEMICONDUCTOR DEVICE WITH EXPOSURE OF SAPPHIRE SUBSTRATE TO ACTIVATED NITROGEN

CROSS REFERENCE TO RELATED APPLICATIONS

This application is a divisional of application Ser. No. 08/560,494 filed Nov. 17, 1995 now abandoned, which is a divisional of application Ser. No. 08/371,708 filed Jan. 13, 1995 (now U.S. Pat. No. 5,633,192), which is a continuation-in-part of application Ser. No. 08/113,964 filed Aug. 30, 1993 (now U.S. Pat. No. 5,385,862), which is a continuation of application Ser. No. 07/670,692 filed Mar. 18, 1991, now abandoned.

BACKGROUND OF THE INVENTION

The invention relates to light emitting devices, and specifically to light emitting group III nitride devices.

Efforts have been made to prepare mono-crystalline GaN because of its potentially useful electrical and optical properties. GaN is a potential source of inexpensive and compact solid-state blue lasers. The band gap for GaN is approximately 3.4 eV, which means that it can emit light on the edge of the UV-visible region.

Despite the desirability of a mono-crystalline GaN layer, its development has been hampered by the many problems encountered during the growth process. Previous attempts to prepare monocrystalline GaN films have resulted in n-type films with high carrier concentration. The n-type characteristic is attributed to nitrogen vacancies in the crystal structure which are incorporated into the lattice during growth of the film. Hence, the film is unintentionally doped with nitrogen vacancies during growth. Nitrogen vacancies affect the electrical and optical properties of the film. ECR-assisted metalorganic vapor phase epitaxy gave GaN films that were highly conductive and unintentionally doped n-type (S. Zembutsu and T. Sasaki *J. Cryst. Growth* 77, 25–26 (1986)). Carrier concentrations and mobilities were in the range of $1 \times 10^{19}$ cm$^{-3}$ and 50–100 cm$^2$ V$^{-1}$ s$^{-1}$. Efforts to dope the film p-type were not successful. The carrier concentration was reduced by compensation, that is, the effect of a donor impurity is "neutralized" by the addition of an acceptor impurity.

Highly resistive films were prepared by sputtering using an ultra-pure gallium target in a nitrogen atmosphere. The films were characterized n-type and the high resistivity was attributed to the polycrystalline nature of the films (E. Lakshmi, et al. *Thin Solid Films* 74, 77 (1977)).

In reactive ion molecular beam epitaxy, gallium was supplied from a standard effusion cell and nitrogen was supplied by way of an ionized beam. Mono-crystalline films were characterized n-type, but higher resistivities of 10$^6$ Ω-cm and relatively low carrier concentrations and mobilities (10$^{14}$ cm$^{-3}$ 1–10 cm$^2$ V$^{-1}$ s$^{-1}$, respectively) were obtained (R. C. Powell, et al. in "Diamond, Silicon Carbide and Related Wide Bandgap Semiconductors" Vol. 162, edited by J. T. Glass, R. Messier and N. Fujimori (Material Research Society, Pittsburgh, 1990) pp. 525–530).

The only reported p-type GaN was a Mg-doped GaN treated after growth with low energy electron beam irradiation (LEEBI). P-type conduction was accomplished by compensation of n-type GaN (H. Amano et al. *Jap. J. Appl. Phys.* 28(12), L2112–L2114 (1989)).

BRIEF SUMMARY OF THE INVENTION

A method of making a semiconductor device includes exposing a surface of a sapphire substrate to activated nitrogen at a predetermined temperature and subsequently depositing a layer of group III nitride semiconductor material, such as gallium nitride, on the surface of the sapphire substrate.

The activated nitrogen contains excited molecular nitrogen (N$_2$*) that readily breaks into separate nitrogen atoms on impact with the substrate. The nitrogen atoms then combine with aluminum atoms in the sapphire substrate to form a layer of atomically smooth AlN. The group III nitride material is grown on this layer.

The layer of group III nitride semiconductor material may be a non-single-crystalline buffer layer on which a second layer of group III nitride semiconductor material is subsequently grown. Additional layers can be added as necessary to make a variety of semiconductor devices, such as transistors, photodetectors, light-emitting diodes, etc. The buffer layer is preferably deposited in a two-step process involving deposition at a relatively low temperature and subsequent crystallization at a higher temperature.

The substrate can be exposed to activated nitrogen by (1) introducing nitrogen-containing gas into a deposition system such as a molecular beam epitaxy chamber, and (2) activating the nitrogen-containing gas within the deposition system. Activation may be accomplished using an electron cyclotron resonance system in conjunction with the reaction chamber, such that a nitrogen plasma is created by interaction between a nitrogen-containing gas and high energy electrons in the chamber created by the electron cyclotron resonance system.

Group III nitride layers grown on the pre-exposed sapphire substrate generally exhibit better morphological properties than similar layers deposited on bare sapphire substrates.

Other aspects, features, and advantages of the present invention will be apparent from the detailed description that follows.

DETAILED DESCRIPTION OF THE PREFERRED EMBODIMENTS

The unintentional doping of GaN has been attributed to the formation of nitrogen vacancies in the GaN lattice. GaN decomposes (and loses nitrogen) at about 650° C., well below the processing temperatures (>1000° C.) of the MOCVD processes referred to above. Therefore, the growth process itself provides sufficient thermal energy for vacancy formation. Growth processes at lower temperatures should reduce the number of nitrogen vacancies in the lattice, prevent the unintentional n-type doping of the GaN lattice and result in intrinsic GaN.

The practice of the present invention forms GaN at significantly lower processing temperatures using an activated nitrogen source. An ECR microwave nitrogen plasma is the preferred activated nitrogen source. A two step heating process permits the formation of mono-crystalline GaN at lower processing temperatures.

Figure 1:
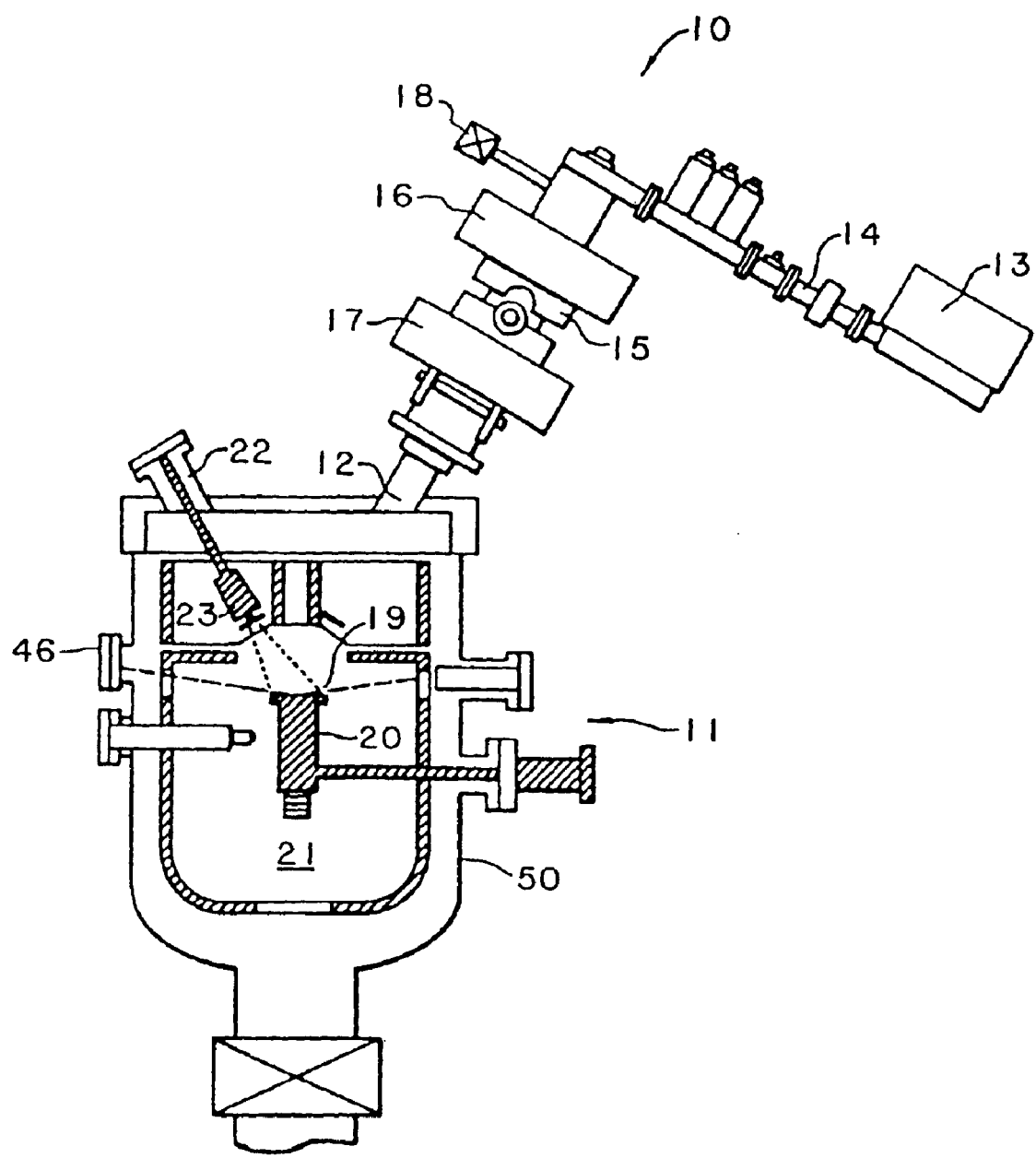
FIG. 1 is a cross-sectional view of an ECR-assisted MBE growth chamber.

One embodiment of an ECR-MBE system used in the present invention is shown in FIG. 1. An ECR-system 10 is integrated with an MBE system 11 by attaching the ECR system 10 to an effusion port 12. ECR system 10 may be an AsTeX model-1000 ECR source, for example. The ECR system 10 includes a microwave generator 13, a waveguide 14, a high vacuum plasma chamber 15, and two electromagnets 16 and 17. The microwaves at 2.43 GHz are created in the microwave generator 13 and travel down the rectangular waveguide 14. The microwave power (100–500 W) passes from the waveguide 14 into the plasma chamber 15. Nitrogen flows into the plasma chamber 15 through a mass flow controller 18. The mass flow controller 18 maintains an adjustable constant flow rate. The plasma chamber 15 is surrounded by the two electromagnets 16 and 17. The upper magnet 16 is powered by a 2 kW power supply (not shown) and the lower magnet 17 is powered by a 5 kW power supply (not shown). Positioning of the electromagnets in this way results in a more intense and stable plasma.

The upper electromagnet 16 sets the free electrons in the chamber 15 into cyclotron orbits. The cyclotron frequency is dependent upon the strength of the magnetic field and the electron charge-to-mass ratio. Since all the electrons assume cyclotron orbits, the energy lost in random motion and collisions is reduced. Additionally, the plasma will be confined to the center of the chamber 15. The magnetic field is adjusted such that the frequency of oscillation of the microwaves is exactly equal to the cyclotron frequency of the electrons. Nitrogen ($N_2$) is then introduced into the chamber through the mass flow controller 18 and part of it is decomposed into atomic and ionic nitrogen and another part of it is converted into excited molecular nitrogen ($N_2^*$) by impact with the high energy electrons. Atomic nitrogen species and excited molecular species are known as neutral excited species. The lower electromagnet 17 then guides the ions through the effusion port 12 towards a substrate 19 which is positioned on and supported by a continuous azimuthal rotation (C.A.R.) unit 20 in a growth chamber 21 of the MBE system 11. The growth chamber 21 is located in a housing 50 into which the effusion ports are connected. The C.A.R. 20 can be rotated between 0 and 120 rpm. On certain substrates, GaN films grow in the wurtzite structure and on others in the zincblende structure. Such substrates include for example sapphire (GaN in wurtzitic structure) and Si(100) (GaN in zincblende structure). Gallium flux is generated in a Knudsen effusion cell 22.

In a typical process, the substrate 19 is sputter-etched by the nitrogen plasma at about 600° C., for example. Other high temperatures, from about 600° C. to about 900° C., for example, may also be used. This process effects nitridation. Nitridation is a process in which sapphire ($Al_2O_3$) is bombarded with nitrogen at relatively high temperatures. The nitrogen replaces the oxygen on the surface of the sapphire and creates atomically smooth AlN. After nitridation, the substrate is cooled down to 270° C. in the presence of the nitrogen plasma. A gallium shutter 23 is then opened to deposit the initial buffer layer of GaN. The use of an activated nitrogen source permits the deposition of GaN at this low temperature. The buffer layer is allowed to nucleate over ten minutes, for example, and then the gallium shutter 23 is closed to stop the nucleation of the film. The substrate is then brought slowly to 600° C. at the rate of 4° C. every 15 seconds in the presence of the nitrogen plasma. The nitrogen overpressure also helps reduce the formation of nitrogen vacancies.

Once at 600° C., the substrate 19 is kept at this temperature for 30 minutes in the presence of nitrogen plasma to ensure that the GaN buffer layer crystallizes. The gallium shutter 23 is opened once again to grow the GaN monocrystalline film. The thickness of the film is preferably about 1 $\mu$m, although in theory there is no limitation to film thickness. Nitrogen pressure and gallium flux are kept constant during the entire process.

The two step growth process allows for the nucleation of a buffer layer. The buffer layer is grown at a temperature in the range of 100°–400° C. but a range of about 100°C. to about 550° C. may also be used. Up to about 400° C., the nucleation layer is mostly amorphous. At about 400° C., the layer becomes crystalline with defects due to stacking faults and misoriented domains. If an amorphous nucleation layer is grown, the layer should be relatively thin (e.g. about 100–200 Å), but should completely cover the substrate. On some instances, thinner buffer layers are desirable because subsequent crystallization of a thin amorphous nucleation layer will be more efficient and will not take as much time as a thicker amorphous layer would. An advantage of using a temperature that causes an amorphous layer is that amorphous layers more readily uniformly cover the entire substrate.

At higher temperatures, such as between about 400° C. and about 550° C., for example, GaN layers are crystalline, though slightly defective. Due to the growth mode at these temperatures being either columnar or three-dimensional, these layers may need to be slightly thicker to ensure complete coverage of the substrate. Slightly defective crystalline buffer layers may be grown from about 200 Å to about 1000 Å, for example.

After the nucleation step, the temperatures increased to a high temperature level to perform a growth step. At these higher temperatures from about 600° C. to about 900° C., for example, amorphous buffer layers crystallize and crystallinity of the defective crystalline buffer layers improves. Since thinner amorphous buffer layers crystallize at a faster rate than do thicker amorphous buffer layers, it may be desirable to sustain the temperature in the chamber at a temperature higher than the nucleation temperature for a period of time before beginning the growth step to ensure the desired crystallization of the nucleation layer. After the amorphous buffer layer has crystallized, or the defective crystalline nucleation layer undergoes further recrystallization, any further growth takes place on the crystallized GaN buffer layer. The films grown by this two step process are superior to those grown by a one step growth process.

Figure 2A:
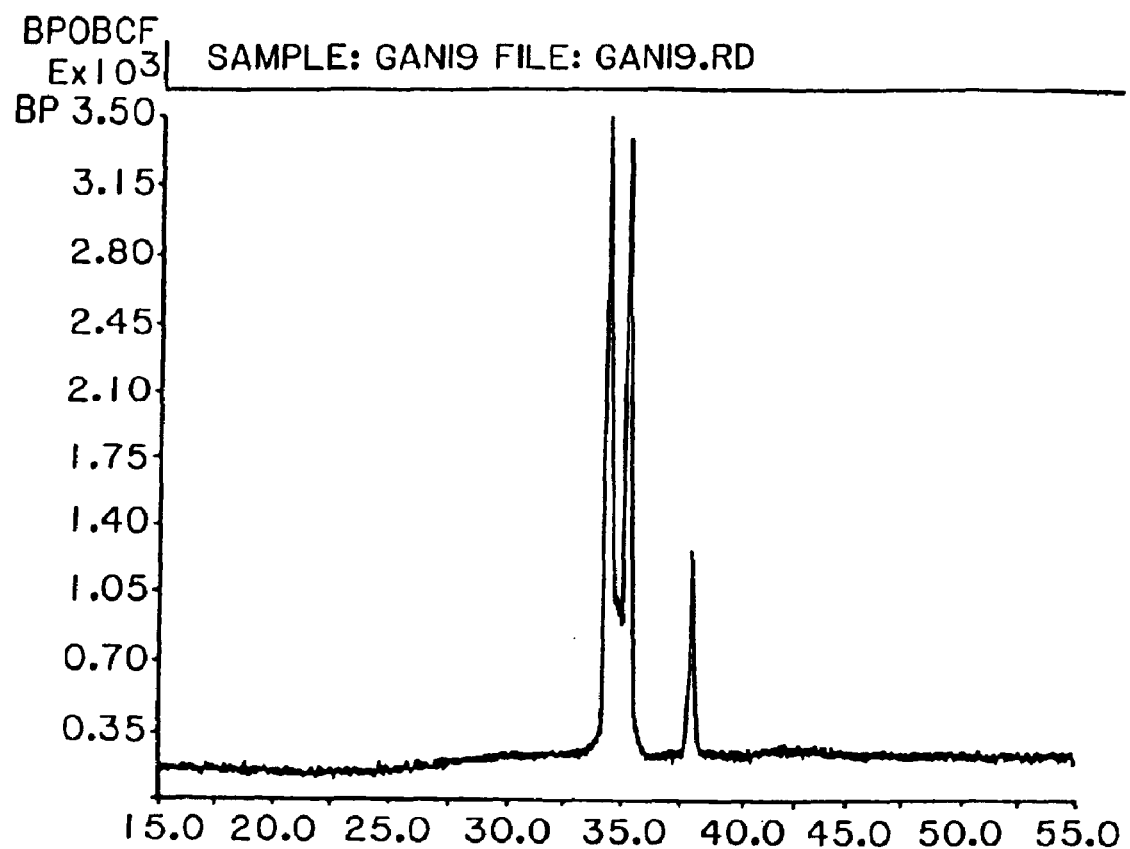
FIG. 2a is an X-ray diffraction pattern from a GaN film on (11-20) sapphire grown from a one-step process.
Figure 2B:
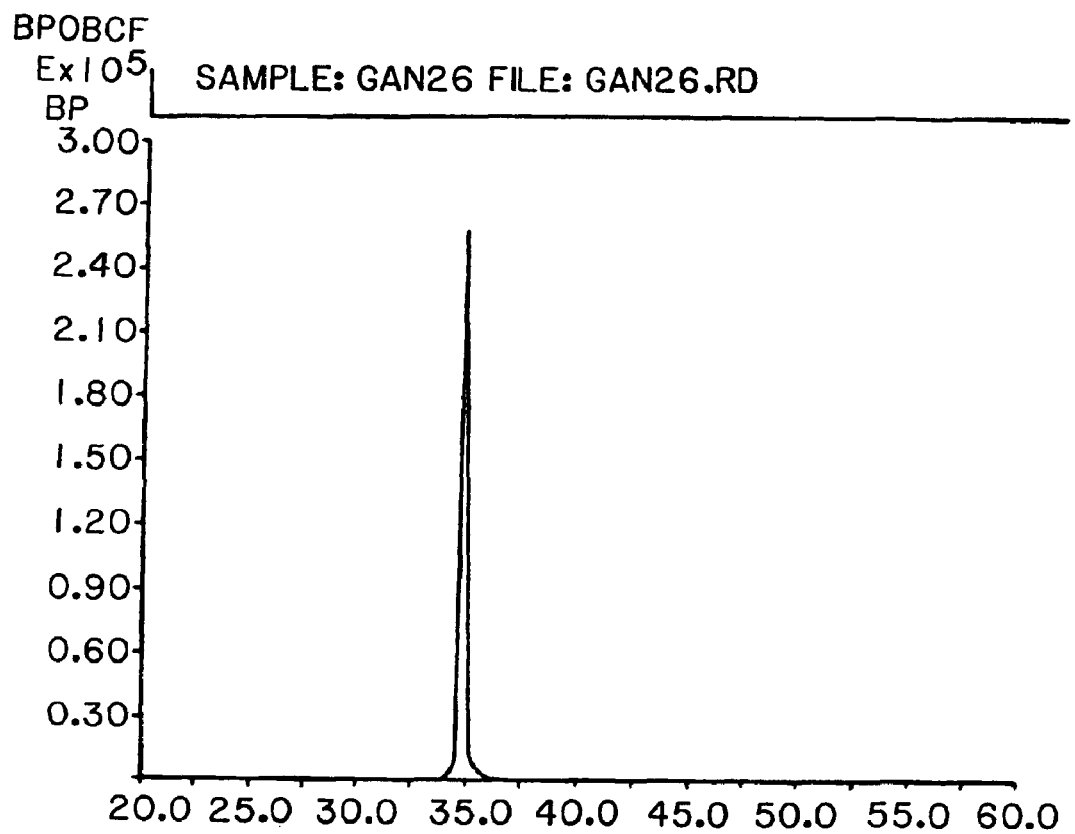
FIG. 2b is an X-ray diffraction pattern from a GaN film on (11-20) sapphire grown from a two-step process.

FIG. 2 shows the X-ray diffraction (XRD) pattern of a GaN film grown on the a-plane of sapphire (11-20) in a one-step process (FIG. 2A) and a two step process (FIG. 2B). The two peaks at about ca. $2\theta=35°$ of FIG. 2A are attributed to a defective GaN crystal. FIG. 2B has a single peak indicating a film of better quality. This is because the majority of the film grows on the top of the GaN buffer and does not contact the underlying substrate. The growth layer of GaN "recognizes" the GaN buffer layer on which it can grow without defects. The buffer is the only part of the film which is highly defective. Films grown by the method described above were highly resistive at room temperature ($10^{12}$ O-cm).

Figure 3:
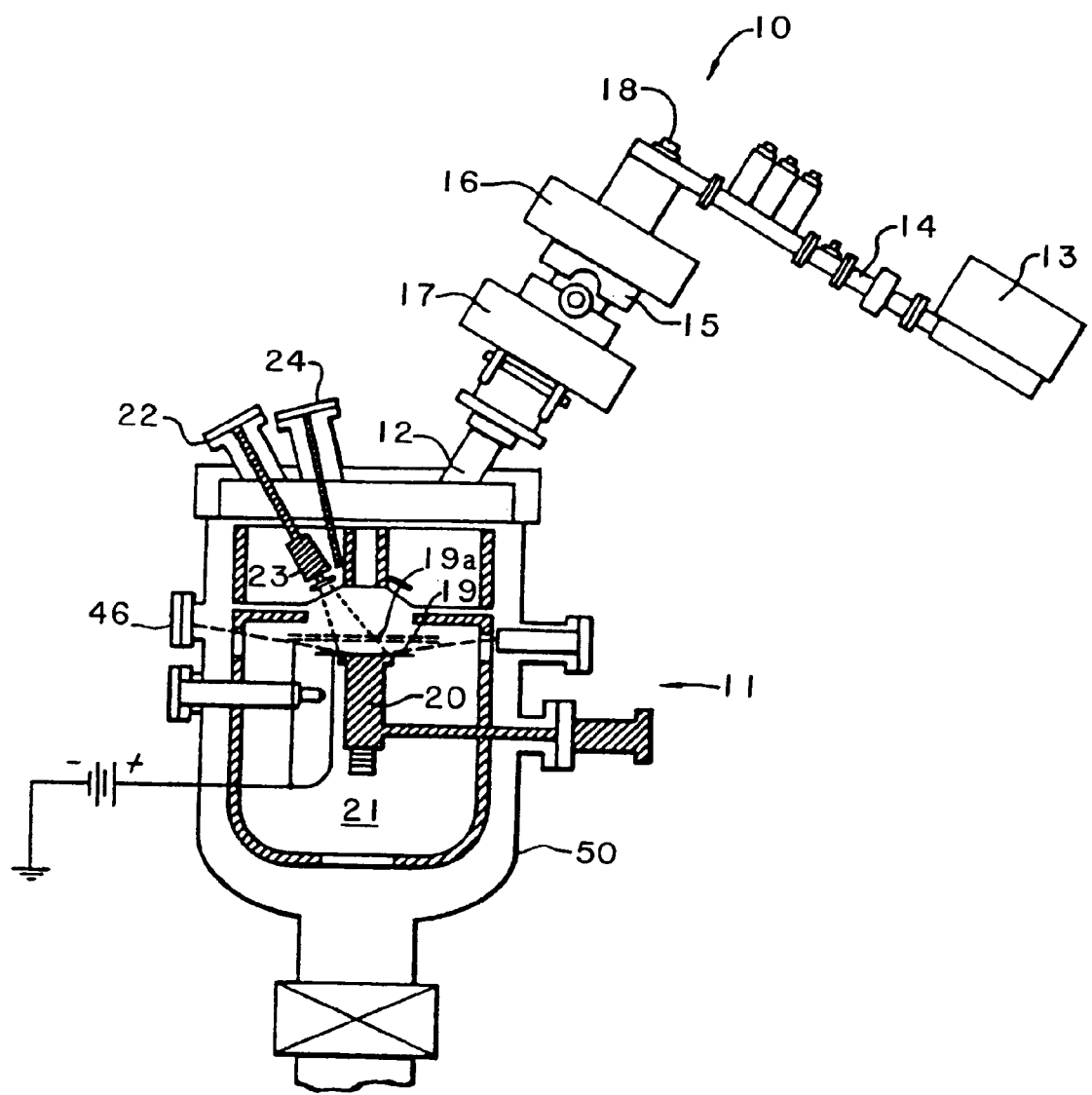
FIG. 3 is a schematic illustration of a device for doping GaN films.

GaN films are doped n-type or p-type by incorporating the proper impurities in their charged state. This is because the energy to incorporate a charged impurity into the lattice is lower than the energy needed to incorporate a neutral impurity. FIG. 3 is a schematic illustration of an apparatus for incorporating a charged acceptor or donor into the GaN lattice. The substrate 19 or a grid 19a, directly in front of the substrate 19, is positively biased. FIG. 3 shows both substrate 19 and grid 19a connected to a voltage source. In practice of this invention, either substrate 19 or grid 19a may be positively biased. Electrons are therefore attracted to the substrate surface, while positive ions such as $N^+$ are repelled. The growth process is carried out as described above with addition of an acceptor source 24 so that gallium, nitrogen and acceptors are deposited on the electron-rich surface of the substrate. As the acceptor atom approaches the surface, it takes on an electron and is incorporated into the lattice as a negative species. The same procedure is used to dope the GaN lattice with donor impurities, except that a negative bias is used on the substrate or the grid. Alternatively, a charged surface can be generated by bombarding the substrate with electrons or positive ions. Electron guns and ion guns, respectively, are conventional sources of these species.

Suitable acceptor species include, but are not limited to, zinc, magnesium, beryllium, and calcium. Suitable donor species include, but are not limited to, silicon, germanium, oxygen, selenium, and sulfur.

Figure 4:
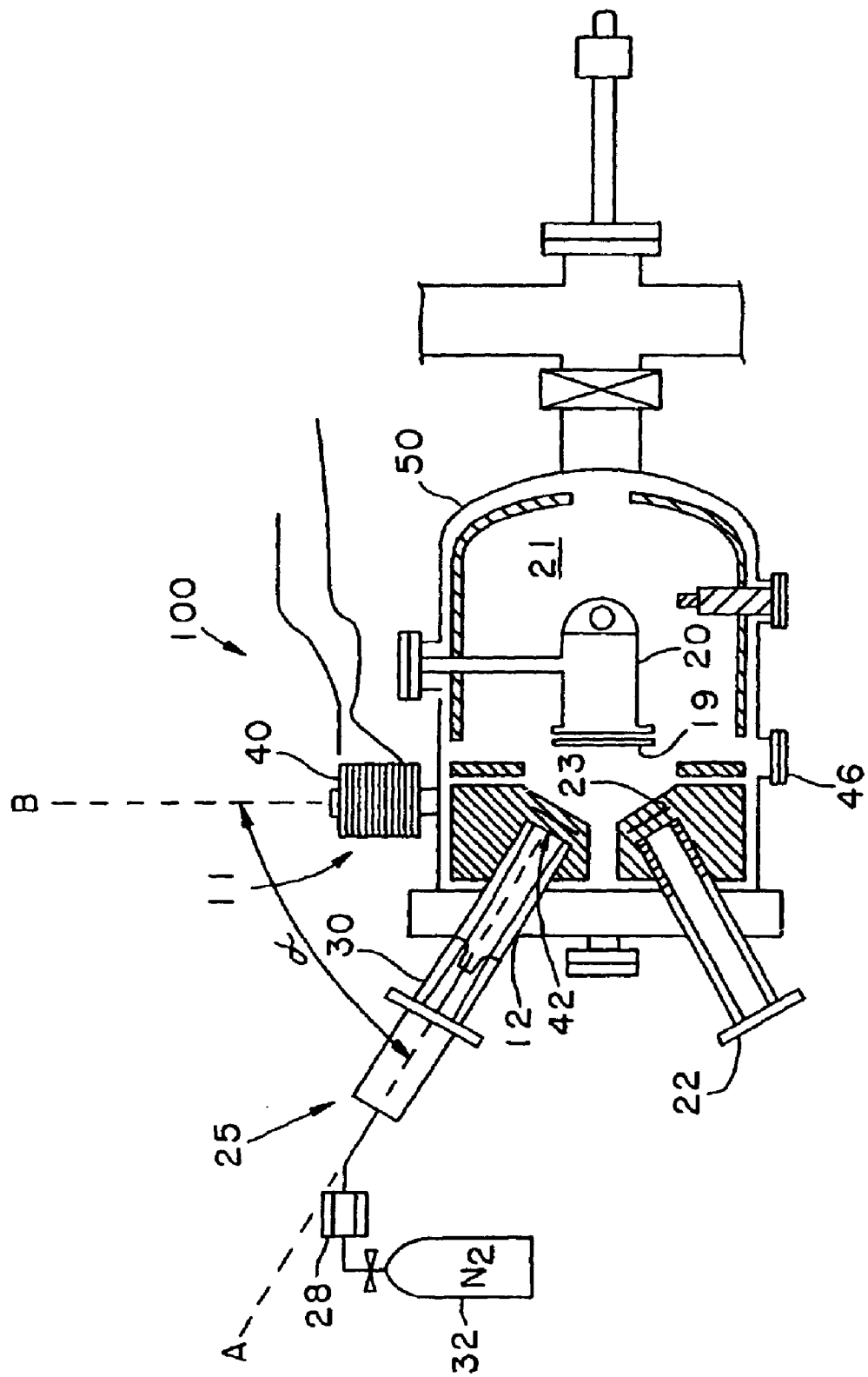
FIG. 4 is a cross-sectional view of one embodiment of an ECR-assisted MBE growth chamber.

In another embodiment of the present invention, a compact ECR source may be used. FIG. 4 depicts a compact ECR-assisted MBE device 100 having a compact ECR-system 25 mounted in a Knudsen effusion cell 30. Thus, this source generates a nitrogen plasma closer to the substrate 19 than a conventional ECR source. Compact ECR-system 25 has an axial solenoid (not shown) to generate the magnetic field used for ECR operation. Compact ECR-system 25 is supplied with nitrogen via nitrogen supply 32. The nitrogen is first purified in nitrogen purifier 28 before entering compact ECR-system 25. Compact ECR-system 25 may be an AsTeX compact ECR source, for example. Compact ECR-system 25 is preferably lightweight, relatively inexpensive compared to traditional ECR sources and operates at much lower microwave powers than a traditional ECR-source, such as the AsTeX model 1000 ECR source, for example. Compact ECR-system 25 uses a microwave power for the growth of GaN films in the range of about 10–100 W. This range of microwave power leads to power densities which are approximately equal to those resulting from operating traditional ECR sources in the range of about 100–500 W.

According to another aspect of this invention, an external solenoid may also be used. FIG. 4 depicts an ECR-assisted MBE device 100 with an external solenoid 40 attached thereto. However, ECR-assisted MBE device 100 may be operated without external solenoid 40 or operated with external solenoid 40 having no current. Further, external solenoid 40 may also be used with ECR-source 10 depicted in FIGS. 1 and 3, or other activated nitrogen sources.

External solenoid 40 is a magnetic device designed to induce a magnetic field. Preferably the magnetic field induced by external solenoid 40 is opposite in sign with respect to substrate 19 to that of the magnetic field generated by the ECR source. External solenoid 40 may be powered by a DC power supply (not shown), for example, to induce the desired magnetic field. External solenoid 40 may comprise a plurality of turns of copper magnet wire wound on a mandrel. For example, 2300 turns of 18 gauge enameled copper magnet wire wound on an iron mandrel may be used. The number of turns, type of wire, and construction of the solenoid may be varied. Preferably, external solenoid 40 is powered by a current of about 5–8 amps. Other amperages may also be used, such as from about 0–10 amps.

As depicted in FIG. 4, external solenoid 40 is preferably disposed outside the housing of the high vacuum plasma chamber 15 of MBE system 11. External solenoid 40 is preferably disposed along an axis B, which is preferably disposed at an angle a with respect to an axis A through ECR-system 25. In a preferred embodiment, angle a is about 60° Other values for angle a may also be used. Additionally, external solenoid 40 is preferably disposed at a reasonable distance from the magnetic coil in the ECR source to avoid unwanted interference in the ECR source. In order for the ECR source to operate properly, a 875 Gauss magnetic field is used. If the external solenoid 40 is too close to the magnetic source in the ECR source, this field may be effected.

In operation, charged species in ECR plasmas are strongly guided along magnetic field lines or, equivalently, down the divergence of the magnetic field by ambipolar diffusion. Thus, the charged nitrogen species travel down the compact ECR-system 25 through the effusion port 12 along the magnetic field lines generated by the ECR magnetic source toward substrate 19. External solenoid 40 alters the direction of the charged species (ionic species) which are produced from compact ECR-system 25. Further, because of the relatively large separation between the external solenoid 40 and the compact ECR-system 25, there is negligible perturbation of the magnetic field inside the ECR-system 25 due to the external solenoid 40 magnetic field. Therefore, the effect on the species generated in the compact ECR-system 25 is negligible.

Figure 5B:
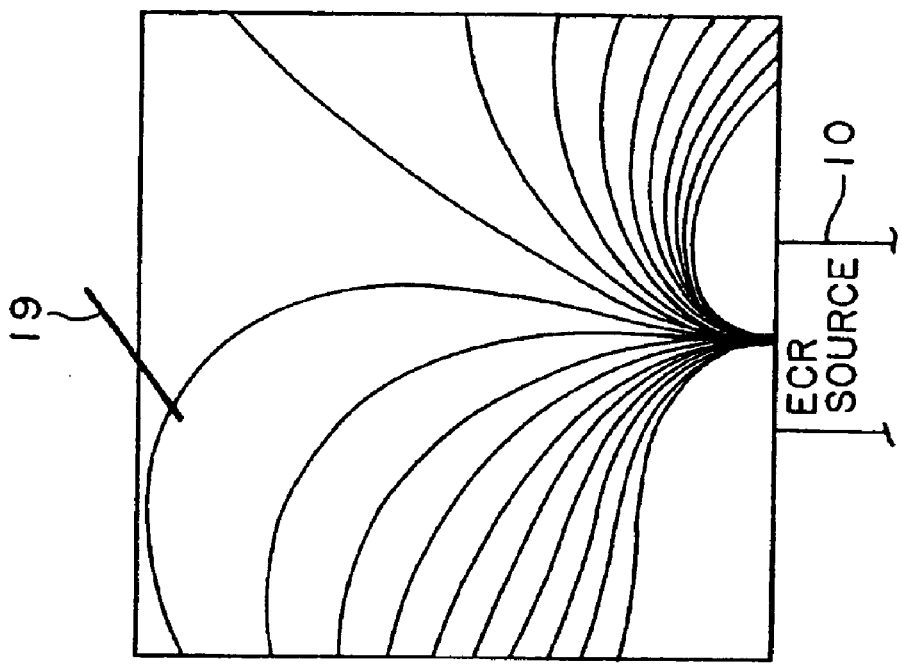
FIG. 5(b) is a schematic depiction of the flow of magnetic field lines emanating from an ECR source when an external solenoid is used, according to one aspect of the present invention.
Figure 5A:
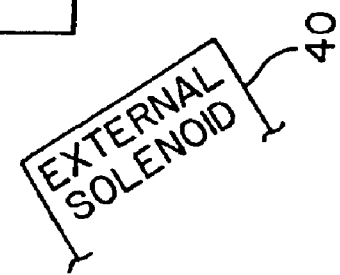
FIG. 5(a) is a schematic depiction of the flow of magnetic field lines emanating from an ECR source having no external solenoid.
Figure 5A:
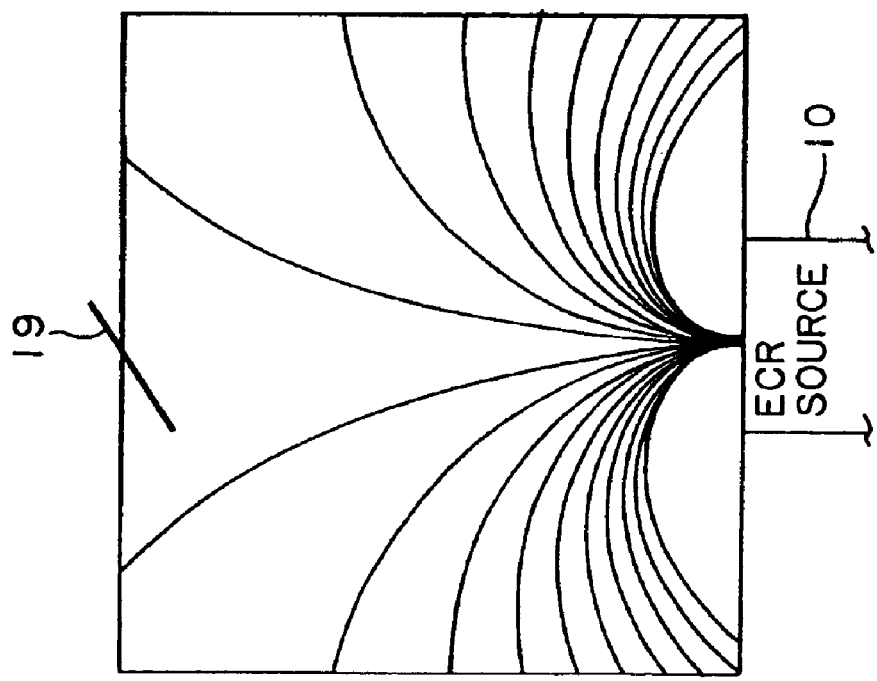

FIG. 5 depicts the effects of an external solenoid 40 on the direction of the charged species. FIG. 5A shows magnetic field lines produced from an ECR source without use of an external solenoid 40. As this figure shows, the field lines are symmetrically directed toward substrate 19. FIG. 5B shows magnetic field lines produced form an ECR source with an external solenoid 40 in use. The external solenoid 40 serves to divert the field lines away from the substrate area. Therefore, by varying the power and position of external solenoid 40 it is possible to selectively control the amount of and the ratio of ions to excited neutral species and atomic species at the substrate. The use of the external solenoid provides a scalable process. By controlling the effective magnetic current of the external solenoid 40, the ion density at the substrate may be altered. Ion density at the substrate may be important because ions at high energies may cause damage to the growth layer. Therefore, by reducing the mount of ions at the substrate, the likelihood of such damage is correspondingly reduced.

Figure 6:
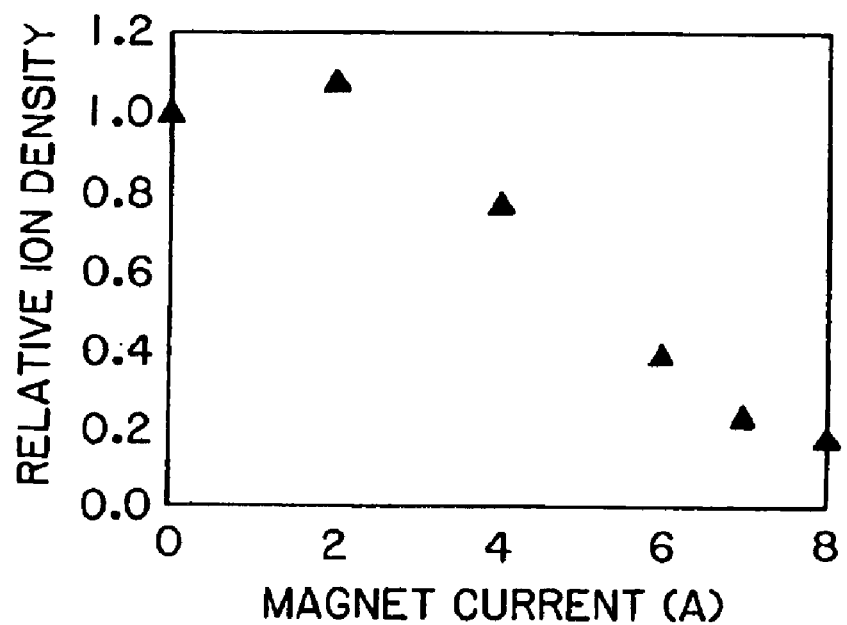
FIG. 6 is a graph showing the effects of variations in the magnet current for an external solenoid and the relative ion density at the substrate.

FIG. 6 depicts one example of how varying the magnetic current of the external solenoid 40 relates to relative ion density. By replacing the substrate 19 with the collector of a nude ionization gauge (Bayard-Alpert type) and using it as a Langmuir probe, the relative ion density as a function of the magnetic current of external solenoid 40 may be measured. FIG. 6 illustrates the scalability of the growth process through the variation of the magnetic current of the external solenoid.

Figure 7:
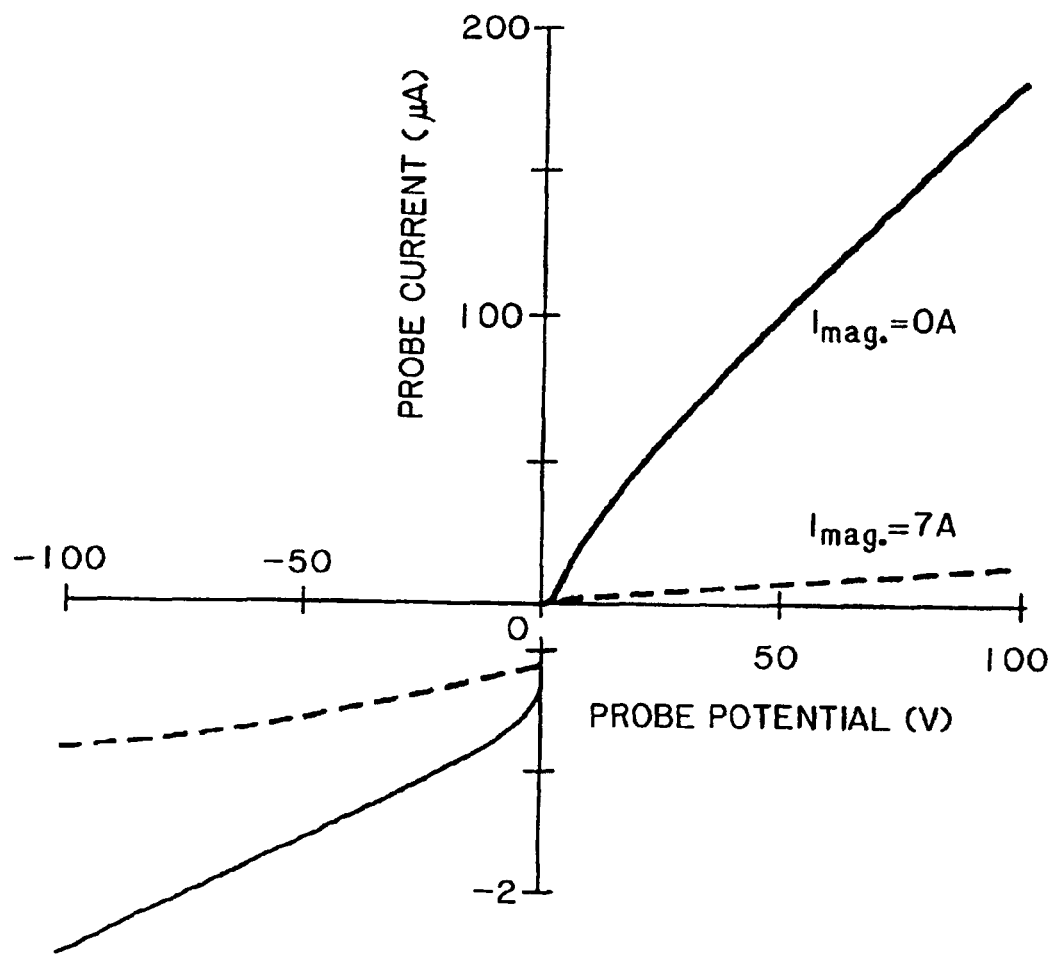
FIG. 7 is a graph showing the I-V characteristics of a Lungmuir probe operating in a device according to one aspect of the invention.

FIG. 7 depicts an I-V characteristic of the Langmuir probe used above operated with external solenoid 40 having a current of 7A and without external solenoid 40. This figure illustrates that activation of external solenoid 40 results in the reduction of both electron and ion densities at the substrate 19 surface.

Films grown with the external solenoid 40 have improved surface morphology, and transport and photoluminescence properties. These differences are attributed to the reduced number of ions in the nitrogen plasma. By using an external solenoid 40, substantially higher quality films may be grown. This external solenoid thus provides a simple, effective, and unobtrusive method of extracting and controlling charged species, particularly where energetic anisotropies of the ionic species resulting from magnetic-field effects make biasing schemes difficult to interpret.

Figure 8:
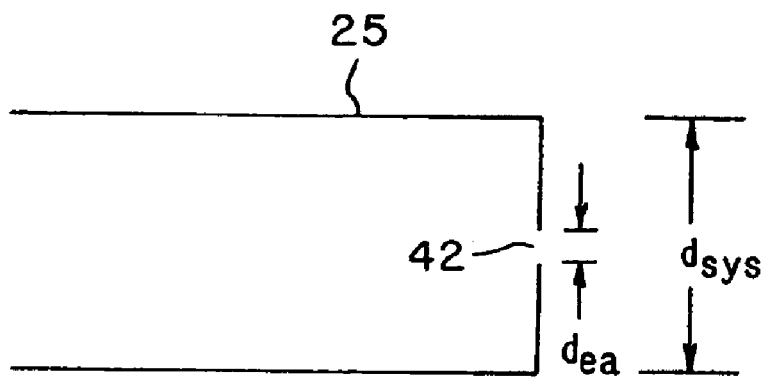
FIG. 8 is a schematic illustration of an effusion cell exit aperture according to one aspect of the present invention.

In another embodiment of the present invention, high energy ion damage may be reduced through the use of a reduced diameter exit aperture at the exit of the ECR-system. Compact ECR-system 25 may be provided with an exit aperture 42 at its exit as depicted in FIGS. 4 and 8. Exit aperture 42 may be formed from a disc (not shown) having a hole disposed therein. The disc may be placed between the ECR system's liner and a wafer spring, which holds both the liner and the disc in place. The ECR system having the disc at its exit is then placed in effusion port 12. The disc may be made of quartz, for example, and may have a thickness of about 1 mm, for example. Other devices for reducing the diameter of the exit of the ECR system may also be used such as a remotely controlled shutter, for example. By using a remotely controlled device, operation of the exit aperture 42 may be varied during operation.

Exit aperture 42 preferably has a diameter, $d_{ca}$, less than the diameter of the ECR-system 25, $d_{sys}$, as shown in FIG. 8. For example, the ECR-system diameter, $d_{sys}$, may be about 2 cm while the diameter, $d_{ca}$, may be varied from about 1 mm to about 1.9 cm, for example, although other diameters may also be used.

By reducing the diameter of the exit of the ECR-system 25, the pressure inside the ECR system 25 is increased. Conversely, increasing the diameter decreases the pressure. Increased pressure promotes collisions between the ions of the plasma. These collisions therefore tend to reduce the energy of the ions and reduce the amount of ionic species which exit the ECR system 25. Any ions that exit the ECR-system 25 have reduced energy and are not as likely to cause damage to the GaN growth layer. If the diameter of the exit aperture 42 is small enough, no ions escape due to a screening effect. The diameter at which "screening" occurs is known as the Debrye screening length. Atomic nitrogen particles, however, pass through this "screen". Atomic nitrogen species are preferred for forming GaN layers.

Controlling the diameter of exit aperture 42 allows control of the amount of ionic species and the ionic energy at the substrate. A smaller hole passes fewer ions and ions with reduced energies. The exit aperture 42 may be used with or without external solenoid 40. Also, the exit aperture 42 may be used with any type of ECR system or other activated nitrogen source to vary the ionic energy directed at the substrate. By using both exit aperture 42 and external solenoid 40, greater flexibility in controlling the growth process can be provided.

Figure 9:
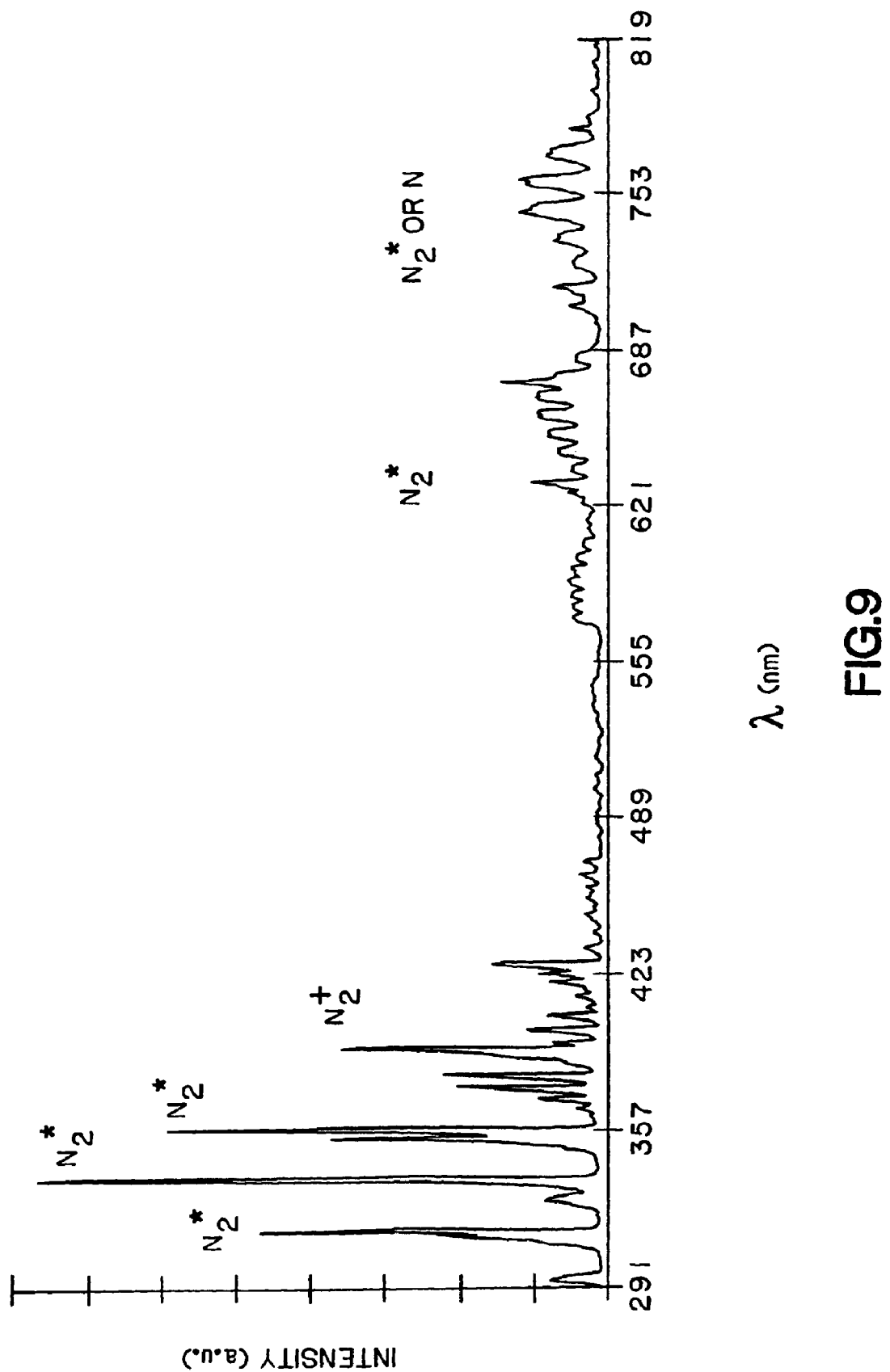
FIG. 9 is a graph illustrating an optical emission spectra for an ECR nitrogen plasma source.
Figure 10:
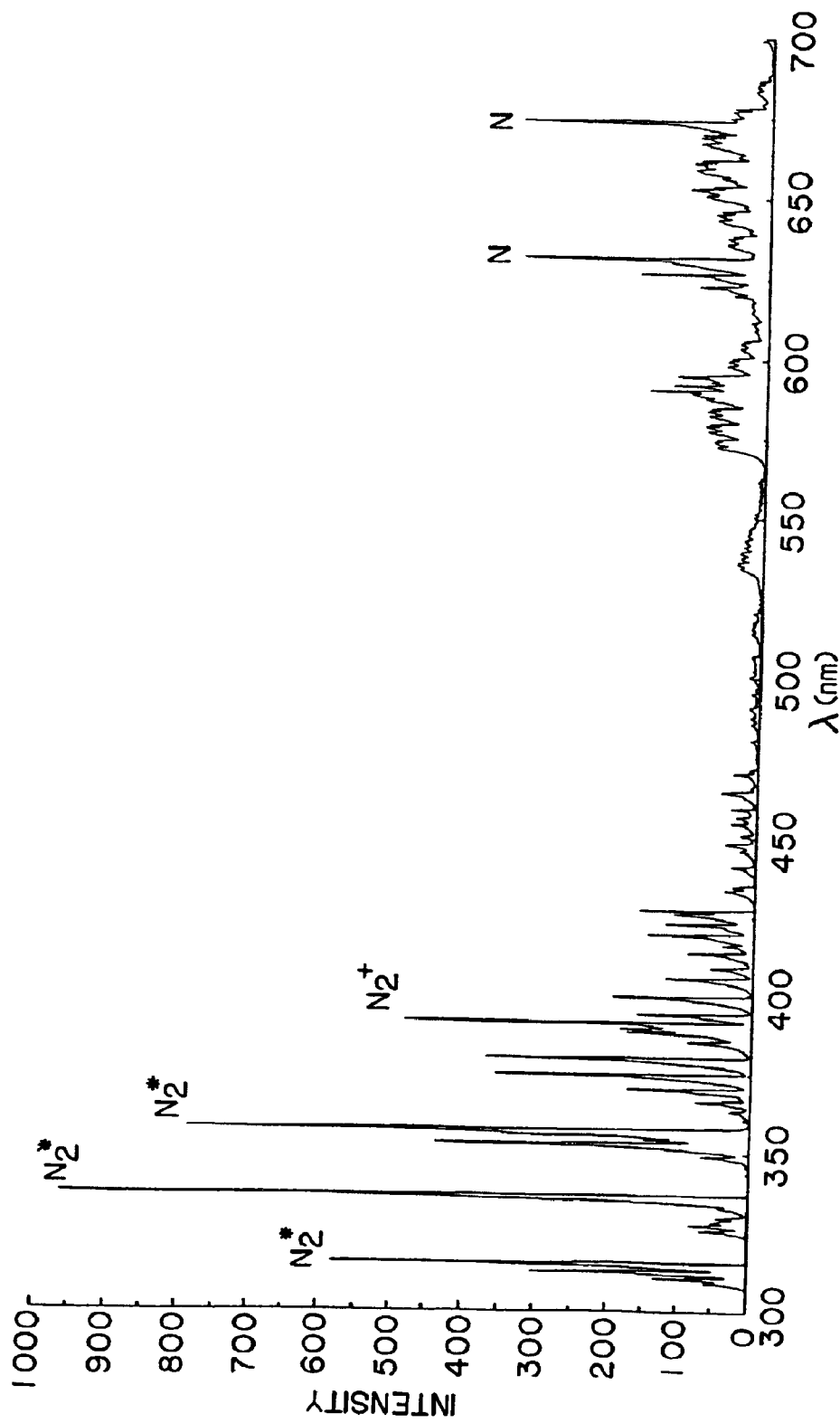
FIG. 10 is a graph illustrating an optical emission spectra for an ECR nitrogen plasma source operating with an exit aperture according to an embodiment of the present invention.

FIGS. 9 and 10 depict the effects of using exit aperture 42. FIG. 9 depicts an optical emission spectra for an ECR nitrogen plasma generated by a compact ECR-system 25 operated at 35 W, with a nitrogen pressure of about $1.2 \times 10^4$ Torr without use of an exit aperture. This figure depicts the presence of ionic nitrogen ($N_2^+$) at about 391.4 nm, molecular excited nitrogen ($N_2^*$), and atomic nitrogen (N). The energy of the atomic nitrogen (N), occurring at wavelengths higher than about 650 nm, is relatively small. FIG. 10 depicts an optical emission spectra for an ECR nitrogen plasma generated by a compact ECR-system 25 having a 1 mm diameter exit aperture 42 in the exit aperture, operated at about 30 W. FIG. 10 depicts sharp peaks of atomic nitrogen at about 625 nm and about 670 nm. Further, the peak at about 391.4 nm for ionic nitrogen is reduced relative to the size of the atomic nitrogen peaks. As these figures indicate, the ratio of energetic ionic species to atomic species is reduced through the use of exit aperture 42. Although these figures depict results of ECR systems operated at different power levels, an ECR system operating with an exit aperture at 35 W would create even greater amounts of atomic nitrogen. Therefore, these figures show the increase in output of atomic nitrogen that is created by increasing the pressure in the ECR system through the use of an exit aperture.

Figure 11:
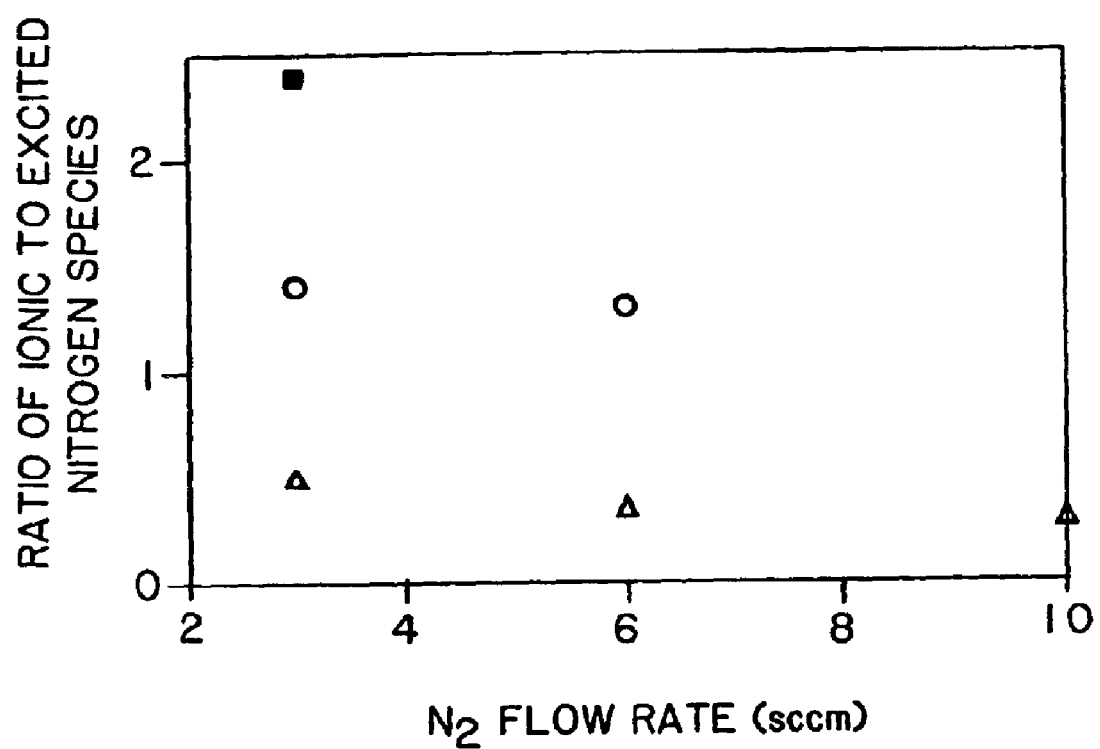
FIG. 11 is a graph illustrating relative ion emission intensity as a function of the nitrogen flow rate and aperture size of an ECR device according to one aspect of the present invention.

The effects of using the exit aperture 42 are also illustrated in FIG. 11. FIG. 11 depicts the ratio of ionic to excited nitrogen species taken for varying sizes of exit aperture 42 and varying rates of nitrogen flow. The squares represent a reading for an ECR source operating without an exit aperture. The circles represent readings for an ECR source operating with a 1 cm exit aperture. The triangles represent readings for an ECR source operating with a 1 mm exit aperture. As FIG. 11 illustrates, when the diameter of exit aperture 42 is smaller, relative ionic emission intensity is less, even for different nitrogen flow rates.

The employment of the external solenoid and/or the use of a restricting exit aperture in the ECR-system allows the doping of the GAN n- or p-type without the use of the substrate biasing as discussed with reference to FIG. 3. Doping with an external magnet or an reduced diameter exit aperture may be accomplished by directing a beam of gallium, activated nitrogen, and the proper dopant toward the substrate.

Figure 12:
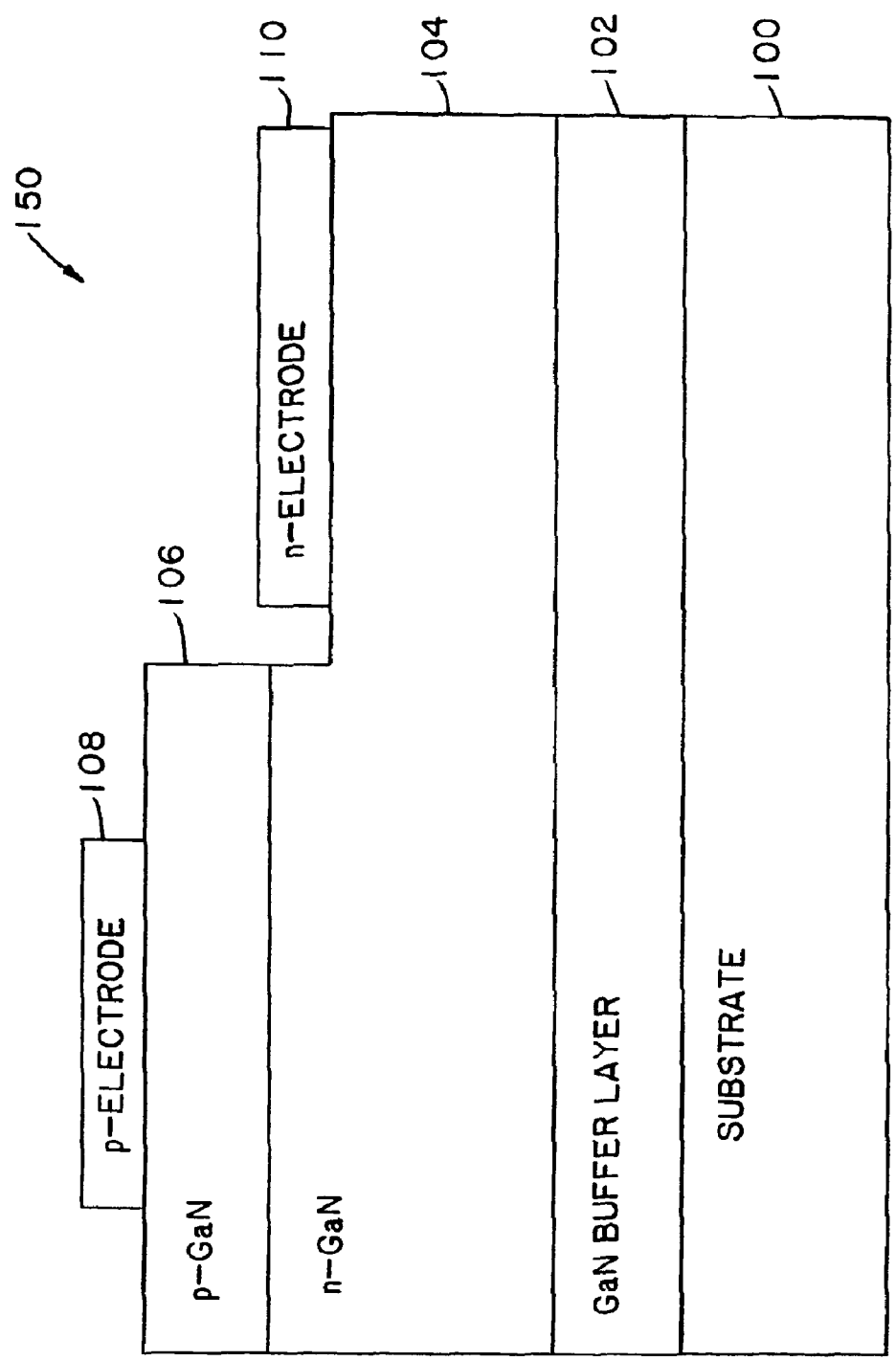
FIG. 12 is a p-n junction device according to one embodiment of the present invention.

According to the present invention p-n junction devices such as light emitting diodes may be formed using various aspects of the invention described above. One embodiment of a light emitting diode of the present invention is depicted in FIG. 12. In FIG. 12, a light emitting diode 150 has a substrate 100, a buffer layer 102, an n-type layer 104, a p-type layer 106, a p-electrode 108 and an n-electrode 110. Substrate 100 may be (100) or (111) silicon; (0001) (basal plane), (11-20) (a-plane), or (1-102) (r-plane) sapphire; (111) or (100) gallium arsenide; magnesium oxide; zinc oxide; or (6H—) or (3C—) silicon carbide or other materials that would be conveniently used for epitaxial growth of Group III-V nitride devices. Buffer layer 102 is preferably a GaN-buffer having a thickness in the range of about 100 Å to about 1000 Å. A thickness of about 300 Å may be used, for example. As described above the thickness may vary depending on the temperature at which it is deposited.

The n-type layer 104 is epitaxially grown on buffer layer 102 and is preferably a GaN layer. N-type layer 104 is either autodoped or intentionally doped and has a thickness in the range of about 0.5–10 μm. A thickness of about 1.0–3.0 μm may be used, for example. The p-type layer 106 is epitaxially grown on n-type layer 104. P-type layer 106 is preferably a doped GaN p-type layer having a thickness of about 0.3–0.5 μm. A thickness of about 0.5 μm may be used, for example.

In a preferred embodiment, as depicted in FIG. 12, p-type layer 106 and a portion of n-type layer 104 may be etched to expose a top surface of n-type layer 104. N-electrode 110 may be formed on the exposed portion of n-type layer 104 and may comprise titanium and aluminum. Preferably a titanium layer having a thickness of about 200 Å covered by an aluminum layer having a thickness of about 2000 Å may be used. P-electrode 108 may be formed on p-type layer 106. P-electrode 108 may comprise nickel (Ni) and gold (Au). Preferably p-electrode 108 comprises a layer of nickel having a thickness of about 200 Å and then a layer of gold having a thickness of about 2000 Å. P-electrode 108 may also comprise platinum. Preferably, the material used for p-electrode 108 should have a work function of about 7.5 eV. Platinum has the highest work function of any known metal at about 5.8 eV.

In an alternative embodiment, when no etching is performed, p-electrode 108 and n-electrode 110 may be formed on p-type layer 106. P-electrode 108 contacts p-type layer 106 directly, as in FIG. 12. N-electrode 110 contacts n-type layer 104 through p-type layer 106 by soldering with indium metal, for example. Other metals and methods of contacting n-type layer 104 through p-type layer 106 may also be used.

A method of forming light emitting diode 150 will now be described. As described above, a substrate 100 is placed in MBE system 11. If the substrate 100 is sapphire, then the sapphire preferably is subjected to a nitridation process at a high temperature, 850° C. for example, to form atomically smooth AlN. Other methods of preparing the substrate depending on the substrate used may also be used before GaN growth.

Once the substrate is prepared, the temperature in the MBE chamber is set at between about 100° C. and about 550° C. to perform a nucleation step to grow buffer layer 102 to a desired thickness, for example, 300° A. As described above, the temperature is one factor in determining whether the nucleation layer will be amorphous or defective crystalline. A temperature of about 500° C. may be used, for example. At this temperature, the activated nitrogen from an ECR-system and the atomic gallium generated by Knudsen effusion cell 22 are directed at the substrate 100. Preferably, compact ECR-system 25 is used to generate the activated nitrogen. The microwave power of the compact ECR-system 25 effects the type of growth which is induced.

Figure 13C:
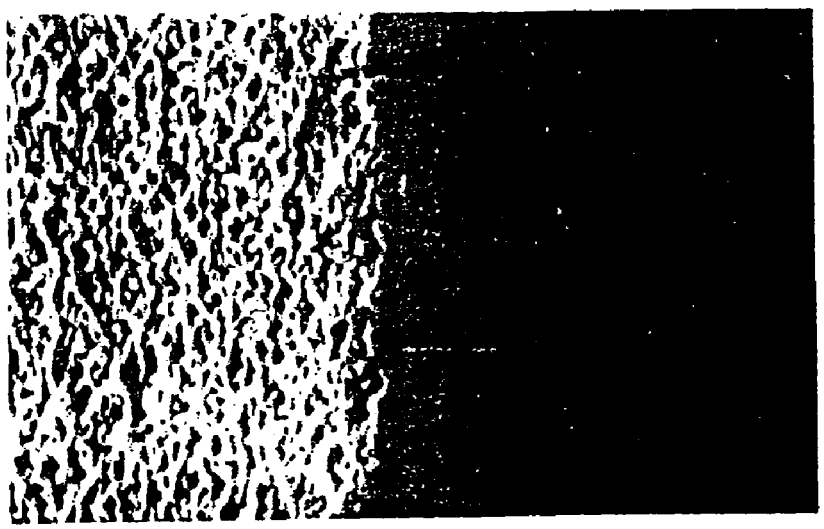
FIGS. 13(a)–(c) depict surface morphologies of films grown according to the present invention using an ECR source operating at different microwave powers.
Figure 13B:
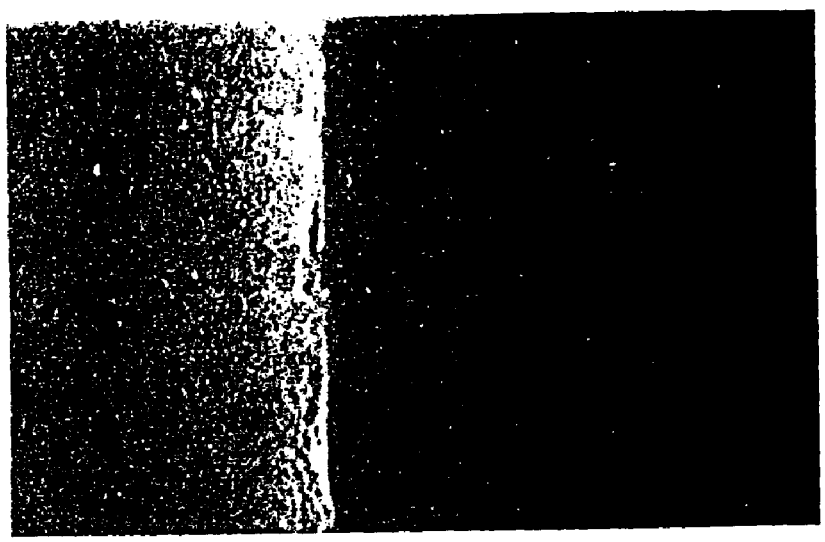
Figure 13A:

FIG. 13 depicts the effect of microwave power on the surface morphology of films. At 25,000 times magnification, FIG. 13(a) depicts the surface of a film grown at 18 W, FIG. 13(b) depicts the surface of a film grown at 20 W, and FIG. 13(c) depicts the surface of a film grown at 25 W. At 18 W, the film has a relatively island-like growth structure. The film grown at 20 W shows a relatively smooth surface typical for layer-by-layer growth. The film grown at 25 W shows a three dimensional growth which leads to rough surface morphologies. A power of about 20 W is preferred to provide smooth layer-by-layer growth as depicted in FIG. 13(b). Other powers may be used, however, depending upon desired parameters. For example, when an exit aperture in the ECR-system and/or the external solenoid is employed, the optimum power in the compact ECR system 25 is between about 30 to about 100 Watts and preferably between about 25–50 Watts.

Then, the substrate is heated gradually at a rate of about 4° C. every fifteen seconds. Other rates of increasing the temperature may also be used depending on the initial quality of the nucleation layer. For example, if the nucleation layer is amorphous, a slower rate of increasing the temperature may be used to ensure that the buffer layer crystallizes. The substrate is heated to the desired high temperature setting to perform one or more growth steps. A temperature in the range of about 600° C. to about 900° C., such as about 800° C., may be used, for example during the growth steps.

Before progressing to the growth step, it is important to determine whether the buffer layer has begun to crystallize. A reflection high-energy electron diffraction (RHEED) apparatus 46 (FIGS. 1, 3 and 4) may be used to monitor the crystallinity of the nucleation layer. For amorphous materials, it may be desirable to maintain the temperature at the high temperature for a period of time, such as at 800° C. for about 30 minutes, for example, before opening the gallium shutter to begin the growth step.

After the desired temperature is established, and the crystallinity of the nucleation layer has reached a desired level, the gallium shutter 23 is opened to begin growth of the n-type layer 104 on the buffer layer 102. The n-type layer 104 is preferably grown to about 1.0–3.0 μm at a deposition rate of about 0.2 μm/hr, for example. As described above, incorporation of n-type impurities may occur by autodoping or by introduction of a donor impurity. A doping level of between $10^{18}$–$10^{19}$ cm$^{-3}$ of net carrier doping may be used.

Once the desired thickness of n-type layer 104 is grown, an acceptor dopant is introduced through another effusion cell to form the p-type layer 106 on top of the n-type layer 104. The acceptor dopant may be chosen from zinc, magnesium, beryllium, and calcium, for example. Other acceptor dopants may also be used. To facilitate incorporation of the acceptor dopants, the substrate 100 may be biased. When a reduced diameter exit aperture or an external solenoid are used, however, biasing does not have significant additional benefits to the doping process due to the selfinduced substrate biasing which results from the exit aperture and/or the external solenoid.

The Mg-acceptor dopant is preferably sublimated from a conventional knudsen cell at a lower temperature than the temperature of the substrate. A temperature of about 230° C. may be used, for example. During the last few minutes of p-type layer growth, the amount of dopant introduced into the layer may be increased. In one embodiment, this may be performed by raising the temperature of the dopant. A temperature of about 270° C. may be used, for example. Other methods for increasing the doping level of the top surface of the p-type layer 106 may also be used. Once the desired thickness of p-type layer 106 is grown, the gallium shutter 23 and the acceptor source are turned off.

By providing the very top layer of the p-type layer with higher doping levels, the p-electrode contacts the valence band by electron tunnelling during LED operation. This is particular useful where the contacts are made from a metal with a work function less than 7.5 ev. In this situation, the conduction of electrons from p-electrode to the p-type layer occurs by electron tunneling.

After the p-type layer 106 has been formed, the device is subjected to etching to remove a portion of the p-type layer 106 and a portion of the n-type layer 104 as depicted in FIG. 12, for example. In one embodiment, the etching occurs in a ring-like fashion. During etching, the ring may be widened to form a hilltop-like formation known as a mesa. Reactive ion etching may be used, for example to remove the desired portion of the GaN device of the present invention. Particularly, silicon tetrachloride may be used as the etching chemical. Other chlorine based etching methods may also be used, such as use of Freon-12, for example. Bromide and fluoride based etching may also be used.

P-electrode 108 is then formed on p-type layer 106. P-electrode 108 may be formed by evaporation of 300 μm diameter dots of 200 Å. of nickel followed by 2000 Å of gold. As noted, platinum may also be used. Other metals, diameters and thicknesses for p-electrode 108 may also be used. N-electrode 110 is then formed on n-type layer 104. N-electrode 110 may be formed by evaporation of a ring around the mesa of 200 Å of titanium followed by 2000 Å of aluminum. A chromium/aluminum ring may also be used. During formation of both p-electrode 108 and n-electrode 106, rapid thermal annealing at relatively high temperatures for a specified duration is preferred to form good ohmic contacts. For example, rapid thermal annealing at about 700° C. for about 20 seconds may be used. In some instances, the n-electrode may be formed, followed by rapid thermal annealing before deposition of the p-electrode.

Figure 14:
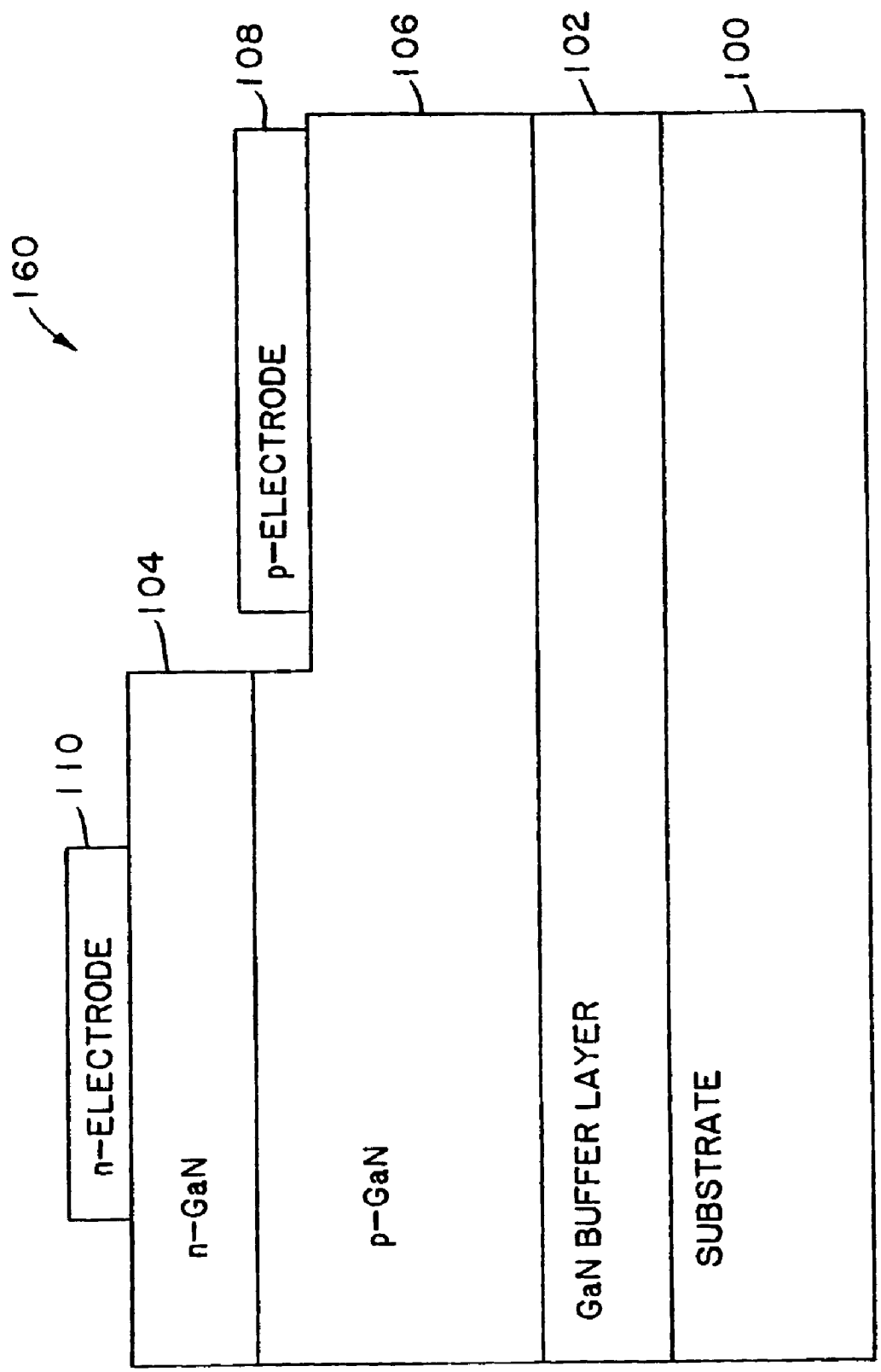
FIG. 14 is a p-n junction device according to another embodiment of the present invention.

In another embodiment of a p-n junction device of the present invention, the positions of n-type layer 104 and p-type layer 106 may be reversed. FIG. 14 depicts a light emitting device 160 of the present invention in which p-type layer 106 is grown on the buffer layer 102 and n-type layer 104 is grown on p-type layer 106. As depicted in FIG. 14, in this embodiment, p-type layer 106 may be grown to a thickness of about 2.0 μm and n-type layer 108 may be grown to a thickness of about 0.5 μm. Other thicknesses of these layers may also be used. It is preferred that the bottom doped layer (formed nearest the substrate) be thicker than the other layer. The bottom layer should be less resistive to allow proper conduction across the p-n junction. Because resistivity is related to length and cross-section, the thicker the bottom layer, the less resistive it is, and correspondingly, the better of a p-n junction device it will make.

In this embodiment, part of n-type layer 104 and a portion of p-type layer 106 may be removed by etching. N-electrode 110 then is deposited directly on n-type layer 104 and p-electrode 108 is deposited directly on p-type layer 106.

In yet another method of forming electrodes 108 and 110, the substrate 100 and buffer layer 102 may be etched to expose the bottom layer, whether it is the n-type layer or the p-type layer. The corresponding electrode may then be formed on the bottom layer of the device.

According to another embodiment of the present invention, an n-type GaN substrate may be used for substrate 100. In this embodiment, an n-type GaN layer 104 may be grown directly on the GaN substrate using a single growth step. P-type layer 106 may then be grown on n-type layer 104. P-type layer 106 could also be grown directly on the GaN substrate with the n-type layer 104 grown on p-type layer 106. Such a structure is an n-p-n bipolar junction transistor. This embodiment may be used in combination with the other structures and methods described except that as noted, a buffer layer is not necessary. However, if desired, one could be used.

In another embodiment, a hot tungsten filament or an ion source such as a Kauffman ion source may be used to supply the activated nitrogen. An ion source directs ions in a desired direction. Therefore, unlike the ECR source, no magnetic lines are needed to direct the ions. In these methods, it may be desirable to bias the substrate positively or negatively to facilitate the p-and n-type growth respectively, as discussed with respect to FIG.

The devices described above may be used to form light emitting diodes or lasers. Advantageously, the use of GaN layers in a p-n junction device omits blue-violet light. These devices may be used for a variety of purposes including full color displays, optical recording devices, laser printing, and underwater communication, to name just a few. These devices may also be used to provide semiconductor laser devices.

EXAMPLE 1

One example of a light emitting diode having a p-n junction according to the present invention is described below. This example is not intended to limit the invention.

A (0001) sapphire substrate was first subjected to a nitridation process at 850° C. to convert its surface to atomically smooth AlN. Next, a GaN-buffer approximately 300 Å thick was deposited at about 500° C. Following the deposition of the GaN-buffer, the substage was heated to about 800° C. and an autodoped n-type GaN film approximately 2 μm was deposited at a deposition rate of 0.2μ/hr. Then, a Mg-doped p-layer approximately 0.5 μm thick was deposited by incorporating Mg which was sublimated from a conventional Knudsen cell at 230° C. The Mg flux was then gradually raised by about an order of magnitude by increasing the cell temperature to about 270° C. near the end of the run to facilitate the electrical contacting of the top player. The device was grown with a reduced diameter aperture of about 1 cm at the exit of the ECR source.

The top p-layer was electrically contacted by thermal evaporation of 300 μm diameter dots of 200 Å of nickel followed by 2000 Å of gold. The bottom n-layer was contacted through the p-layer be soldering with indium metal. For testing purposes, the chip was then mounted in a chip carrier with silver paint and connected with an ultrasonic wire bonder.

A second device was grown using the above procedure additionally using an external solenoid operating at a magnet current of about 7 amps.

Results

The n-type layers had a carrier concentration of about $5 \times 10^{18}$ cm$^{-3}$ and electron mobilities of about 80 cm$^2$ Vs. The p-type layers had a net carrier concentration of $5 \times 10^{17}$ cm$^{-3}$ and a hole mobility of 6 cm$^2$/Vs. The I-V characteristics of the devices indicated a turn on voltage of around 3 volts.

The devices' emission spectra were measured by dispersing the light through a spectrometer and detecting it with a photomultiplier. The devices were driven with a pulse generator at about 40 Hz and a 10% duty cycle to facilitate locked-in measurements. The spectra were measured at a drive current of about 150 mA or a current density of about 212 A/cm$^2$.

Figure 15:
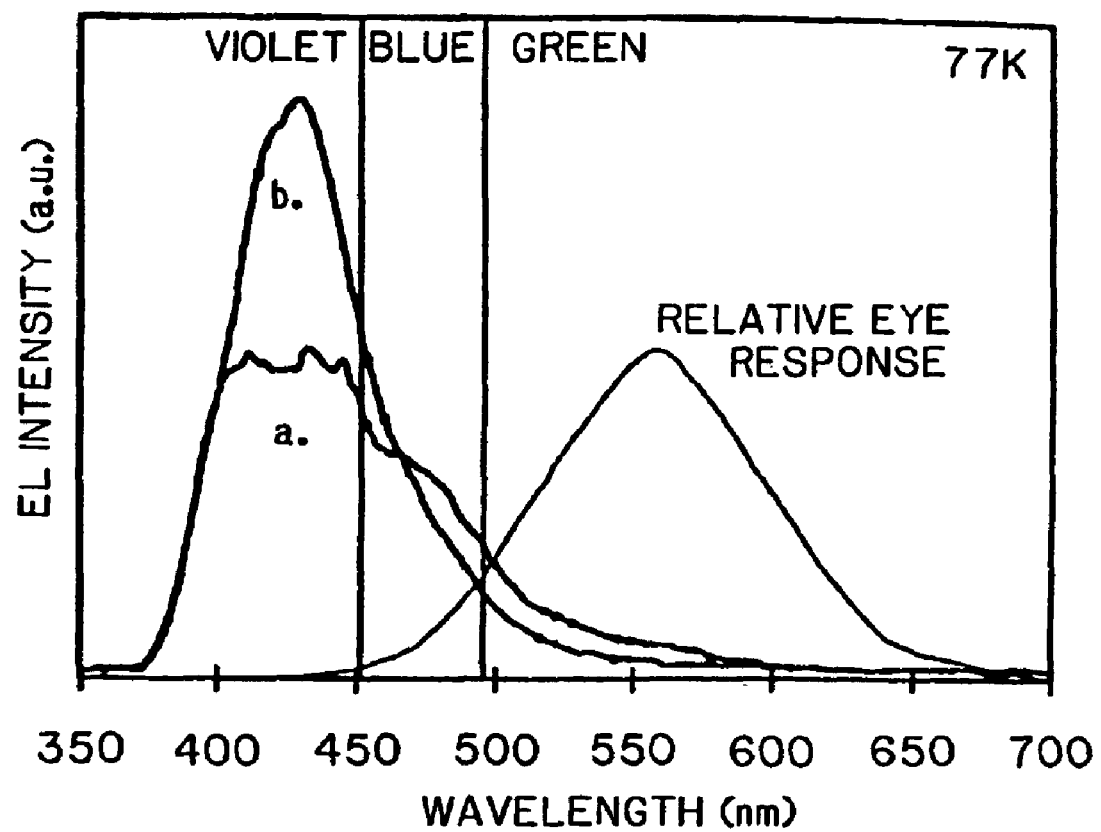
FIG. 15 is a graph showing the EL spectra of a light emitting diode grown without (a) and with (b) an external solenoid.

The EL spectra for the above devices were measured after immersing the chip in liquid nitrogen at about 77K. FIG. 15 depicts the results of the EL spectra measurements. Curve (a) represents the EL spectra of a device fabricated from layers grown without external solenoid 40 and curve (b) represents the EL spectra of a device fabricated from layers grown with external solenoid 40 driven at about 7 amps. The peak emission at about 430 nm is characteristic of Mg-doped GaN homojunction LED's. This peak is in the violet part of the spectrum. By using external solenoid 40 to minimize ion damage in the film, a reduction in this tail as well as an enhancement of the peak at about 430 nm is achieved resulting in a bluish-violet apparent color.

A GaN blue-violet light emitting p-n junction has thus been grown by MBE. These devices do not require a post-growth thermal annealing or LEEBI treatment step to activate the Mg acceptors in the p-layer. Blue emissions characteristic of Mg luminescence centers are observed.

EXAMPLE 2

An LED device was grown using a procedure as set out in Example 1 with an external solenoid. Instead of placing the contacts on the p-type layer, reactive ion etching was performed to expose the underlying n-type layer. A p-electrode and an n-electrode were then formed on the p-type layer and the n-type layer, respectively, followed by rapid thermal annealing of the metal contacts as described above.

Results

Figure 16:
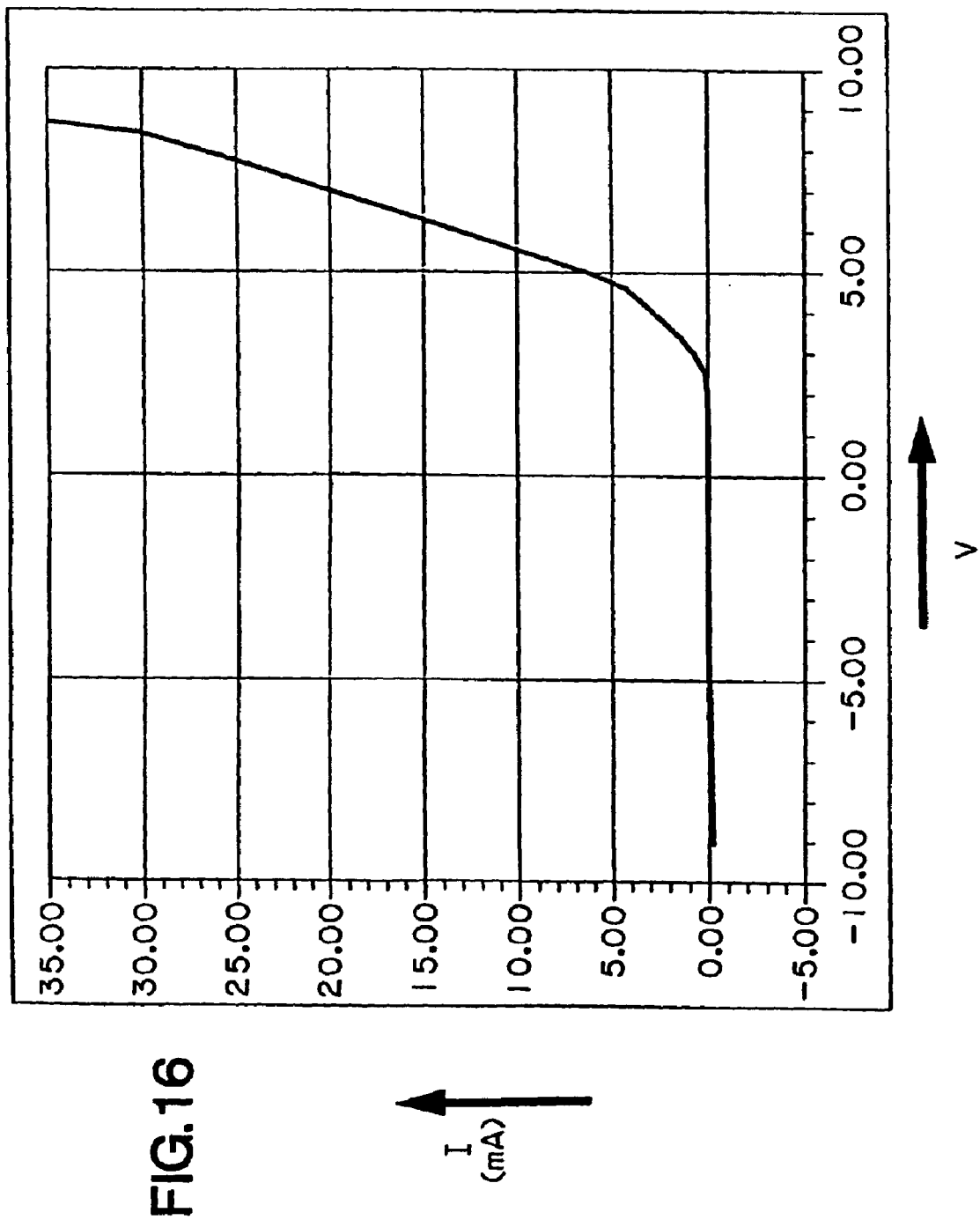
FIG. 16 is a graph showing the I-V characteristics of a p-n junction device according to one embodiment of the present invention.

The I-V characteristics of a device as described in Example 2 are illustrated in FIG. 16. The device of Example 2 exhibits excellent I-V characteristics with a turn on voltage of about 3 volts.

While this invention has been described with reference to specific embodiments, it is not intended that the invention been limited thereto. The invention is only limited by the claims which follow.

What is claimed is:

1. A method of making a semiconductor device, comprising:
    exposing a surface of a sapphire substrate to activated nitrogen at a predetermined temperature; and
    subsequently depositing a layer of group III nitride semiconductor material on the surface of the sapphire substrate.

2. A method according to claim 1, wherein the predetermined temperature is about 600 degrees C.

3. A method according to claim 1, wherein the predetermined temperature is in the range of 600 to 900 degrees C.

4. A method according to claim 1, wherein the group III nitride semiconductor material comprises gallium nitride.

5. A method according to claim 1, wherein exposing comprises (1) introducing nitrogen-containing gas into a deposition system, and (2) activating the nitrogen-containing gas within the deposition system.

6. A method according to claim 5, wherein the deposition system comprises a molecular beam epitaxy reaction chamber, and wherein the activated nitrogen includes activated nitrogen species contained within a nitrogen plasma in the molecular beam epitaxy reaction chamber.

7. A method according to claim 6, wherein the molecular beam epitaxy reaction chamber has an electron cyclotron resonance system attached thereto, and wherein the nitrogen plasma is created by interaction between the nitrogen-containing gas and high energy electrons in the molecular beam epitaxy reaction chamber created by the electron cyclotron resonance system.

8. A method according to claim 6, wherein the molecular beam epitaxy reaction chamber has a heated tungsten filament therein, and wherein the nitrogen plasma is created by interaction between the nitrogen-containing gas and the heated tungsten filament.

9. A method according to claim 5, wherein the predetermined temperature is about 600 degrees C.

10. A method according to claim 5, wherein the predetermined temperature is in the range of 600 to 900 degrees C.

11. A method according to claim 1, wherein the layer of group III nitride semiconductor material is a first layer, and further comprising depositing a second layer of group III nitride semiconductor material on the first layer.

12. A method according to claim 8, wherein the first layer is deposited as a non-single-crystalline buffer layer.

13. A method according to claim 12, wherein the buffer layer is a re-crystallized, partially amorphous layer.

14. A method according to claim 9, wherein (1) the layer of group III nitride semiconductor material is a non-single-crystalline buffer layer, and (2) the predetermined temperature is a first temperature, and further comprising depositing a second layer of group III nitride semiconductor material on the first layer, and wherein depositing the buffer layer comprises:
    first depositing the group III nitride semiconductor material at a predetermined second temperature lower than the first temperature; and
    subsequently raising the temperature of the substrate in the presence of activated nitrogen to a third temperature close to the first predetermined temperature, and maintaining the third temperature for a predetermined time to cause the layer of group III nitride material to crystallize.

15. A method according to claim 13, wherein:
    the first temperature is about 600 degrees C.;
    the second temperature is about 270 degrees C.; and
    the third temperature is about 600 degrees C.

16. A method according to claim 13, wherein:
    the first temperature is in the range of 600 to 900 degrees C.;
    the second temperature is in the range of 100 to 400 degrees C.; and
    the third temperature is in the range of 600 to 900 degrees C.

17. The method according to claim 1, wherein exposing the surface of the sapphire substrate comprises exposing the surface of the sapphire substrate to activated nitrogen at a predetermined temperature for a predetermined amount of time.

* * * * *

UNITED STATES PATENT AND TRADEMARK OFFICE
CERTIFICATE OF CORRECTION

| | |
|---|---|
| PATENT NO. | : 6,953,703 B2 |
| APPLICATION NO. | : 10/610332 |
| DATED | : October 11, 2005 |
| INVENTOR(S) | : Theodore D. Moustakas |

It is certified that error appears in the above-identified patent and that said Letters Patent is hereby corrected as shown below:

Column 9, line 16, "(6H—) or (3C—)" should read --(6H--) or (3C--)--; and

Column 12, line 55, "player" should read --p-layer--.

Signed and Sealed this

Twelfth Day of December, 2006

JON W. DUDAS
*Director of the United States Patent and Trademark Office*